(12) United States Patent
Tokunaga et al.

(10) Patent No.: US 10,894,887 B2
(45) Date of Patent: Jan. 19, 2021

(54) COMPOSITION FOR FORMING FILM PROTECTING AGAINST AQUEOUS HYDROGEN PEROXIDE SOLUTION

(71) Applicant: NISSAN CHEMICAL CORPORATION, Tokyo (JP)

(72) Inventors: Hikaru Tokunaga, Toyama (JP); Yuto Hashimoto, Toyama (JP); Keisuke Hashimoto, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 16/606,546

(22) PCT Filed: Apr. 10, 2018

(86) PCT No.: PCT/JP2018/015082
§ 371 (c)(1),
(2) Date: Oct. 18, 2019

(87) PCT Pub. No.: WO2018/203464
PCT Pub. Date: Nov. 8, 2018

(65) Prior Publication Data
US 2020/0131376 A1    Apr. 30, 2020

(30) Foreign Application Priority Data

May 2, 2017   (JP) .................................. 2017-092007
Dec. 12, 2017 (JP) .................................. 2017-237886

(51) Int. Cl.
*C09D 5/00* (2006.01)
*C09D 7/63* (2018.01)
(Continued)

(52) U.S. Cl.
CPC ............... *C09D 5/00* (2013.01); *C09D 7/63* (2018.01); *C09D 133/066* (2013.01); *C09D 133/14* (2013.01); *C09D 161/18* (2013.01); *C09D 175/14* (2013.01); *C09D 179/02* (2013.01); *C09K 13/00* (2013.01); *G03F 7/11* (2013.01); *H01L 21/0273* (2013.01);
(Continued)

(58) Field of Classification Search
None
See application file for complete search history.

(56) References Cited

U.S. PATENT DOCUMENTS 6,033,830 A    3/2000 Sinta et al.
7,226,721 B2   6/2007 Takei et al.
(Continued)

FOREIGN PATENT DOCUMENTS

JP  2006-251562 A    9/2006
JP  2007-099943 A    4/2007
(Continued)

OTHER PUBLICATIONS

Jul. 10, 2018 Search Report issued in International Patent Application No. PCT/JP2018/015082.
(Continued)

*Primary Examiner* — Ali Naraghi
(74) *Attorney, Agent, or Firm* — Oliff PLC

(57) ABSTRACT

A composition for forming protective film against aqueous hydrogen peroxide solution, composition including resin; compound of following Formula (1a), (1b), or (1c):

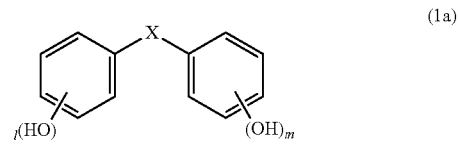

(1a)

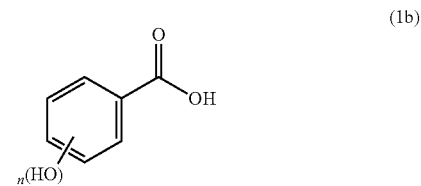

(1b)

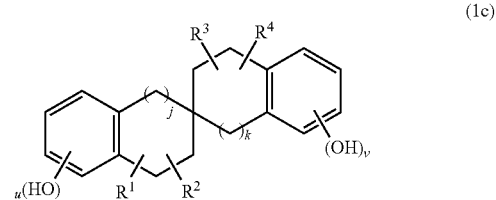

(1c)

(wherein X is carbonyl group or methylene group; 1 and m are each independently integer of 0-5 to satisfy relation: $3 \leq l+m \leq 10$; n is integer of 2-5; u and v are each independently integer of 0-4 to satisfy relation: $3 \leq u+v \leq 8$; $R^1$-$R^4$ are each independently hydrogen atom, hydroxy group, $C_{1-10}$ hydrocarbon group, or $C_{6-20}$ aryl group; when $R^1$-$R^4$ are each the $C_{1-10}$ hydrocarbon group; and j and k are each independently 0 or 1); crosslinking agent and catalyst; and solvent, wherein amount of compound of Formula (1a), (1b), or (1c) is at most 80% by mass relative to amount of resin, and amount of crosslinking agent is 5%-40% by mass relative to amount of resin.

7 Claims, No Drawings

(51) Int. Cl.

| | |
|---|---|
| *C09D 133/06* | (2006.01) |
| *C09D 133/14* | (2006.01) |
| *C09D 161/18* | (2006.01) |
| *C09D 175/14* | (2006.01) |
| *C09D 179/02* | (2006.01) |
| *C09K 13/00* | (2006.01) |
| *G03F 7/11* | (2006.01) |
| *H01L 21/02* | (2006.01) |
| *H01L 21/027* | (2006.01) |
| *H01L 21/311* | (2006.01) |
| *C08K 5/053* | (2006.01) |
| *C08K 5/13* | (2006.01) |
| *C08K 5/132* | (2006.01) |
| *G03F 7/16* | (2006.01) |

(52) U.S. Cl.
CPC .. *H01L 21/02118* (2013.01); *H01L 21/31138* (2013.01); *H01L 21/31144* (2013.01); *C08K 5/053* (2013.01); *C08K 5/13* (2013.01); *C08K 5/132* (2013.01); *G03F 7/162* (2013.01); *G03F 7/168* (2013.01)

(56) References Cited

U.S. PATENT DOCUMENTS

| | | |
|---|---|---|
| 2006/0210915 A1 | 9/2006 | Takei et al. |
| 2016/0211142 A1* | 7/2016 | Kim ................... H01L 21/02282 |
| 2016/0218013 A1 | 7/2016 | Ohashi et al. |
| 2016/0363863 A1 | 12/2016 | Sakaida et al. |
| 2017/0285477 A1* | 10/2017 | Tanigaki ............... G03F 7/0047 |
| 2017/0329220 A1 | 11/2017 | Kato et al. |
| 2018/0201805 A1* | 7/2018 | Ho ..................... C08G 73/1067 |

FOREIGN PATENT DOCUMENTS

| | | |
|---|---|---|
| JP | 4145972 B2 | 9/2008 |
| JP | 2016-099374 A | 5/2016 |
| WO | 2005/013601 A1 | 2/2005 |
| WO | 2015/030060 A1 | 3/2015 |
| WO | 2015/093323 A1 | 6/2015 |
| WO | 2016/084855 A1 | 6/2016 |

OTHER PUBLICATIONS

Jul. 10, 2018 Written Opinion of the International Searching Authority issued in International Patent Application No. PCT/JP2018/015082.

* cited by examiner

COMPOSITION FOR FORMING FILM PROTECTING AGAINST AQUEOUS HYDROGEN PEROXIDE SOLUTION

TECHNICAL FIELD

The present invention relates to a composition for forming a protective film having excellent resistance against an aqueous hydrogen peroxide solution in a lithography process. The present invention also relates to a pattern forming method using the protective film.

BACKGROUND ART

A lithography process has been known which involves formation of a resist underlayer film between a substrate and a resist film provided above the substrate for forming a resist pattern having a desired shape. However, a conventional resist underlayer film; for example, a resist underlayer film disclosed in Patent Document 1, which is formed from a composition containing an aminoplast crosslinking agent, has poor resistance against an aqueous hydrogen peroxide solution. Thus, such a resist underlayer film cannot be used as a mask in a wet etching process using an aqueous hydrogen peroxide solution.

Patent Document 2 discloses an underlayer film-forming composition for lithography containing a compound having a protected carboxyl group, a compound having a group capable of reacting with a carboxyl group, and a solvent; or an underlayer film-forming composition for lithography containing a compound having a group capable of reacting with a carboxyl group and a protected carboxyl group, and a solvent. The composition does not contain an aminoplast crosslinking agent as an essential component. However, Patent Document 2 neither describes nor suggests the resistance of a resist underlayer film formed from the composition against an aqueous hydrogen peroxide solution.

Patent Document 3 discloses a pattern forming method using a resist underlayer film having resistance against a basic aqueous hydrogen peroxide solution. The composition for forming the resist underlayer film contains an epoxy group-containing polymer having a weight average molecular weight of 1,000 to 100,000 and a solvent.

PRIOR ART DOCUMENTS

Patent Documents

Patent Document 1: Japanese Patent No. 4145972
Patent Document 2: International Publication WO 2005/013601
Patent Document 3: International Publication WO 2015/030060

SUMMARY OF THE INVENTION

Problems to be Solved by the Invention

In recent years, an increasing demand has arisen for a protective film having resistance against an aqueous hydrogen peroxide solution much higher than that of a conventional protective film. An object of the present invention is to provide a novel composition for forming a protective film having resistance against an aqueous hydrogen peroxide solution, and a pattern forming method using the protective film.

Means for Solving the Problems

The present inventors have solved the aforementioned problems through application of a composition containing a benzophenone derivative, diphenylmethane derivative, or benzoic acid derivative having a plurality of phenolic hydroxy groups, a crosslinking agent, and a resin component, wherein each of the derivative and the crosslinking agent is contained in an specific amount relative to the amount of the resin component. The term "phenolic hydroxy group" as used herein refers to a hydroxy group bonded to a benzene ring.

A first aspect of the present invention is a composition for forming a protective film against an aqueous hydrogen peroxide solution, the composition comprising a resin; a compound of the following Formula (1a), (1b), or (1c):

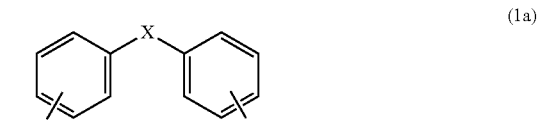

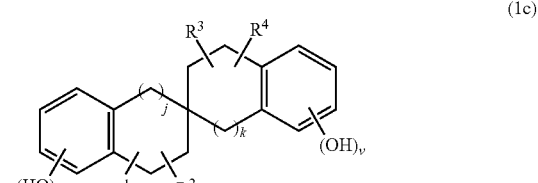

(wherein X is a carbonyl group or a methylene group; l and m are each independently an integer of 0 to 5 so as to satisfy the relation: $3 \leq l+m \leq 10$; n is an integer of 2 to 5; u and v are each independently an integer of 0 to 4 so as to satisfy the relation: $3 \leq u+v \leq 8$; $R^1$, $R^2$, $R^3$, and $R^4$ are each independently a hydrogen atom, a hydroxy group, a $C_{1-10}$ hydrocarbon group optionally having at least one hydroxy group as a substituent and optionally having at least one double bond in a main chain, or a $C_{6-20}$ aryl group optionally having at least one hydroxy group as a substituent; when $R^1$, $R^2$, $R^3$, and $R^4$ are each the $C_{1-10}$ hydrocarbon group, $R^1$ and $R^2$ optionally form a benzene ring together with a ring carbon atom to which $R^1$ and $R^2$ are bonded, $R^3$ and $R^4$ optionally form a benzene ring together with a ring carbon atom to which $R^3$ and $R^4$ are bonded, or the benzene ring optionally has at least one hydroxy group as a substituent; and j and k are each independently 0 or 1); a crosslinking agent; a crosslinking catalyst; and a solvent, wherein the amount of the compound of Formula (1a), (1b), or (1c) is at most 80% by mass relative to the amount of the resin, and the amount of the crosslinking agent is 5% by mass to 40% by mass relative to the amount of the resin.

The aforementioned resin is, for example, a polymer having a weight average molecular weight of 1,000 or more, or a monomer having a molecular weight of 600 or less. The monomer is, for example, a compound of the following Formula (2):

Ar-Q-Ar  (2)

(wherein each Ar is an aryl group, and the aryl group has at least one hydroxy group as a substituent; and Q is a methylene group or a divalent linking group having at least one benzene ring or naphthalene ring).

The compound of Formula (1a) is, for example, any of compounds of the following Formulae (1a-1) to (1a-5). The compound of Formula (1b) is, for example, a compound of the following Formula (1b-1) or (1b-2). The compound of Formula (1c) is, for example, a compound of the following Formula (1c-1).

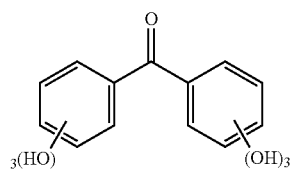
(1a-1)

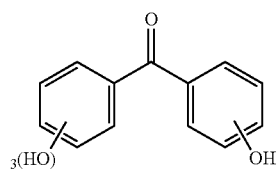
(1a-2)

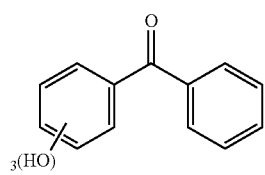
(1a-3)

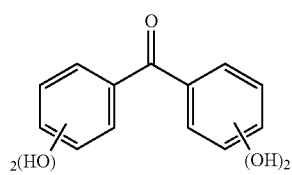
(1a-4)

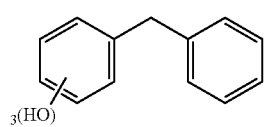
(1a-5)

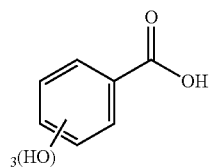
(1b-1)

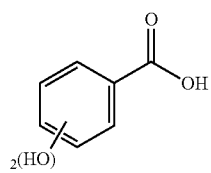
(1b-2)

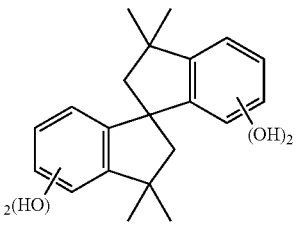
(1c-1)

The composition for forming a protective film may be a composition for forming a resist underlayer film.

A second aspect of the present invention is a pattern forming method comprising forming a protective film, on a semiconductor substrate optionally having an inorganic film formed on its surface, from the composition for forming a protective film against an aqueous hydrogen peroxide solution according to the first aspect of the present invention; forming a resist pattern on the protective film; dry-etching the protective film with the resist pattern serving as a mask, to thereby expose the surface of the inorganic film or the semiconductor substrate; wet-etching the inorganic film or the semiconductor substrate with the dry-etched protective film serving as a mask by using an aqueous hydrogen peroxide solution; and washing the wet-etched inorganic film or semiconductor substrate.

Examples of the aforementioned aqueous hydrogen peroxide solution include a basic aqueous hydrogen peroxide solution containing ammonia, sodium hydroxide, potassium hydroxide, sodium cyanide, potassium cyanide, triethanolamine, or urea; and an acidic aqueous hydrogen peroxide solution containing hydrochloric acid or sulfuric acid. When the aqueous hydrogen peroxide solution is a basic aqueous hydrogen peroxide solution containing ammonia, the basic aqueous hydrogen peroxide solution is, for example, a mixture of (A) a 25% by mass to 30% by mass aqueous ammonia solution, (B) a 30% by mass to 36% by mass aqueous hydrogen peroxide solution, and (C) water. The ratio by volume of the aqueous hydrogen peroxide solution (B) to the aqueous ammonia solution (A); i.e., (B)/(A) is, for example, 0.1 to 20.0, and the ratio by volume of the water (C) to the aqueous ammonia solution (A); i.e., (C)/(A) is, for example, 1.0 to 50.0.

Effects of the Invention

The protective film formed from the protective film-forming composition of the present invention has resistance against an aqueous hydrogen peroxide solution. Thus, the protective film formed from the protective film-forming composition of the present invention can be used as a mask in an etching process using an aqueous hydrogen peroxide solution and in a washing process.

MODES FOR CARRYING OUT THE INVENTION

Components contained in the protective film-forming composition of the present invention will next be described in detail.

[Resin]

The protective film-forming composition of the present invention contains a resin as an essential component. The resin may be a polymer having a weight average molecular weight of 1,000 or more. Examples of the polymer include, but are not particularly limited to, polyester, polyether, polyether ether ketone, novolac resin, maleimide resin, acrylic resin, and methacrylic resin. The upper limit of the weight average molecular weight of the polymer is, for example, 100,000 or 50,000.

The resin may be a monomer having a molecular weight of 600 or less instead of the polymer having a weight average molecular weight of 1,000 or more. The monomer is, for example, a compound of Formula (2) and has a molecular weight of, for example, 150 to 600. Examples of the aryl group of Ar in Formula (2) include phenyl group, biphenyl group, naphthyl group, anthryl group, and phenanthryl group. When Q is a divalent linking group having at least one benzene ring or naphthalene ring, the divalent linking group is, for example, a divalent group prepared by substitution of at least one of two hydrogen atoms of a methylene group with a phenyl group, a biphenyl group, or a naphthyl group, a divalent aromatic group selected from the group consisting of a phenylene group, a biphenylene group, and a naphthylene group, and a divalent group having the divalent aromatic group and a methylene group, an ether group (—O— group), or a sulfide group (—S— group). Examples of the monomer include compounds of the following Formulae (2-1) to (2-3).

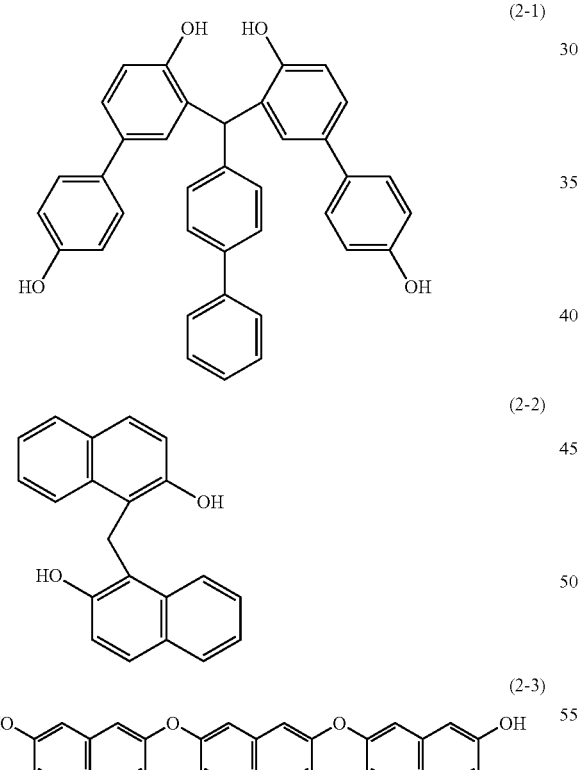

[Compound of Formula (1a), (1b), or (1c)]

The protective film-forming composition of the present invention contains a compound of Formula (1a), (1b), or (1c) as an essential component. Examples of the compound of Formula (1a) include compounds of the following Formulae.

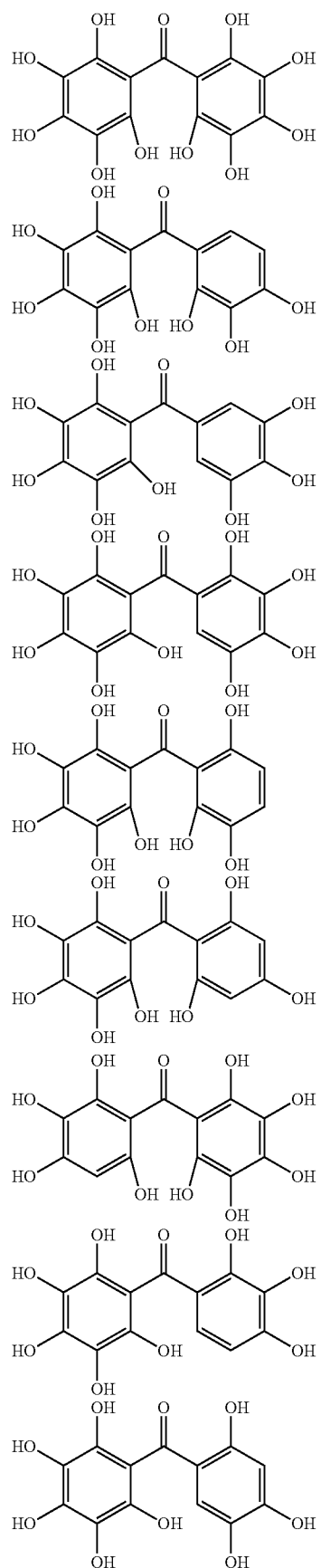

-continued
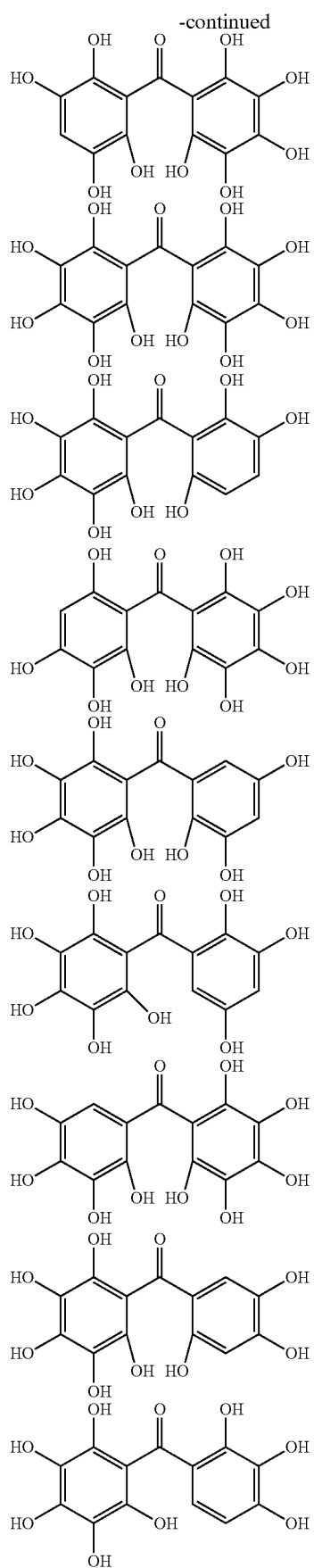
-continued
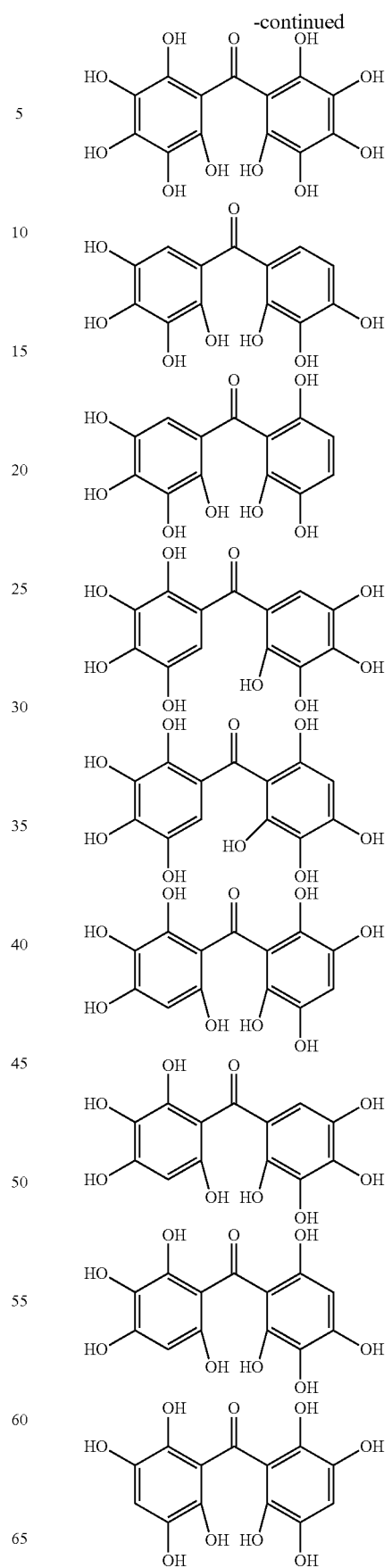

-continued
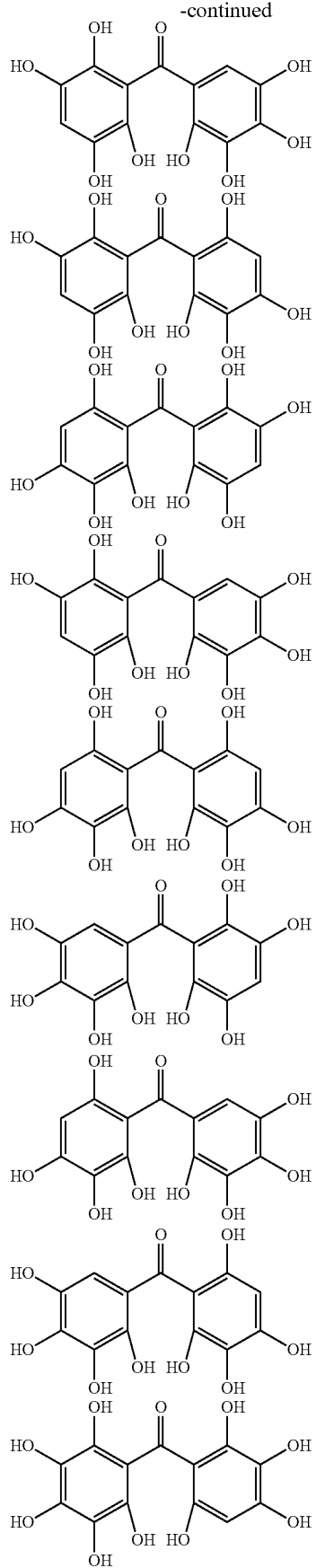
-continued
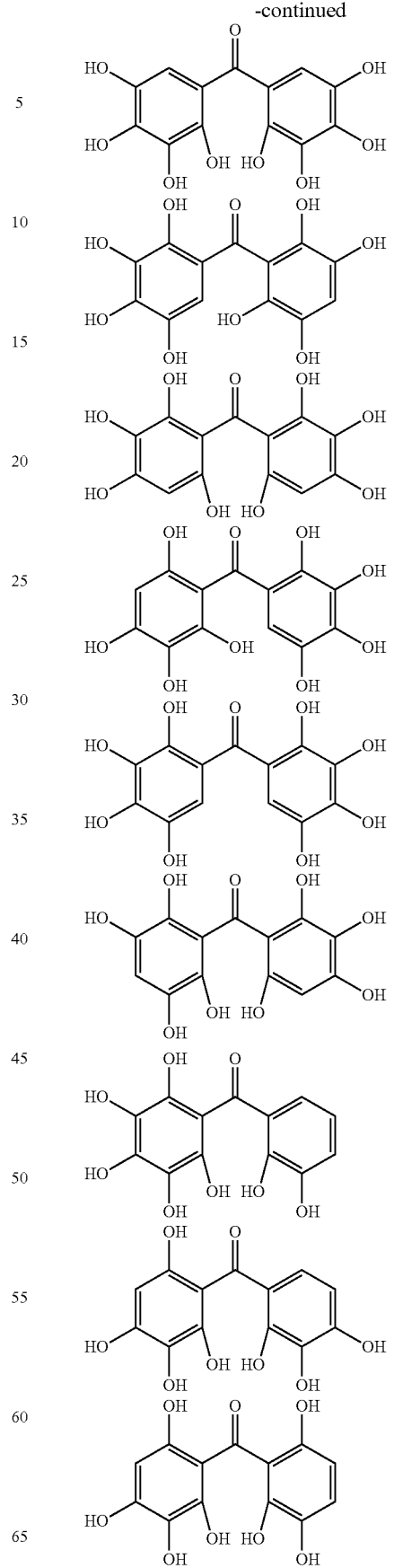

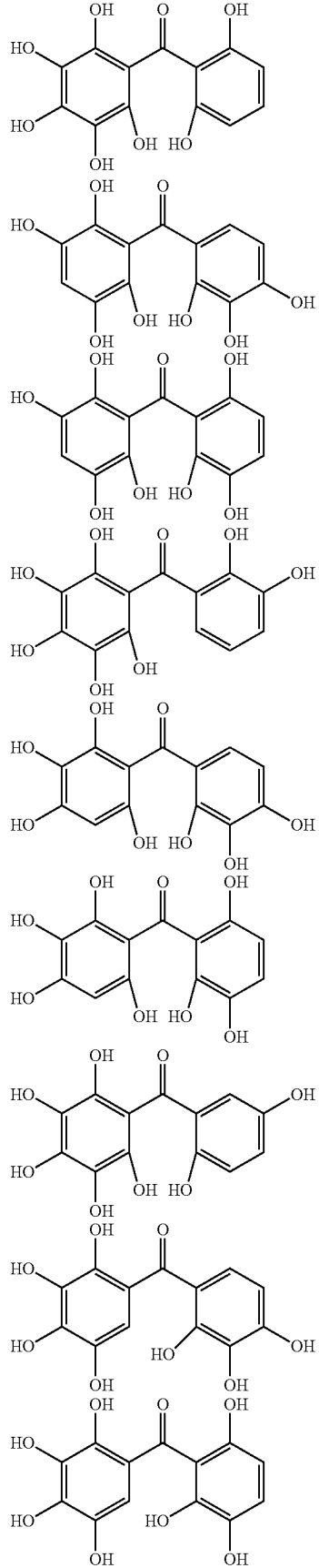
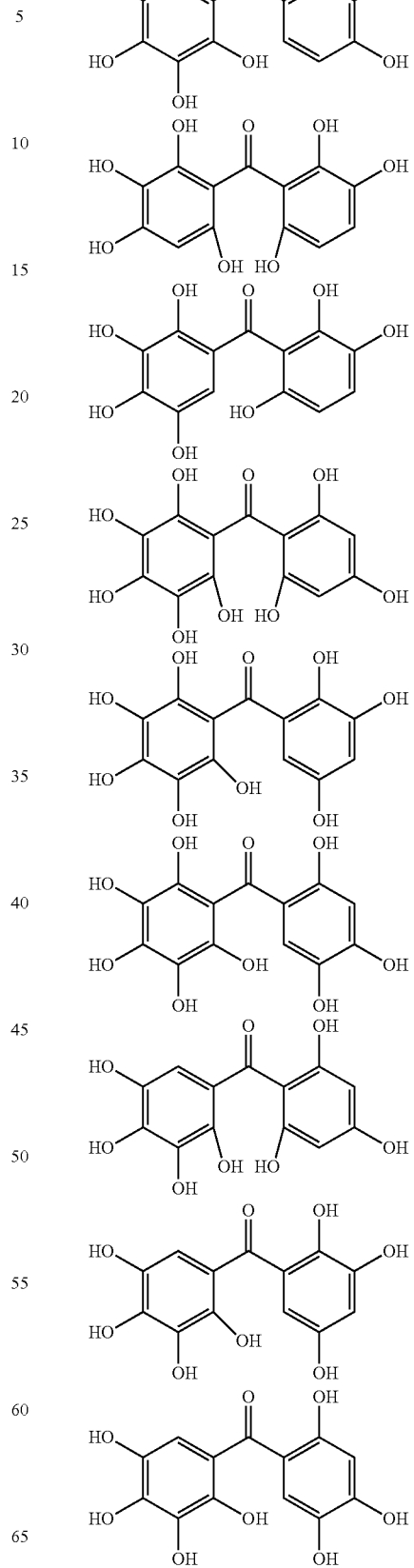

-continued
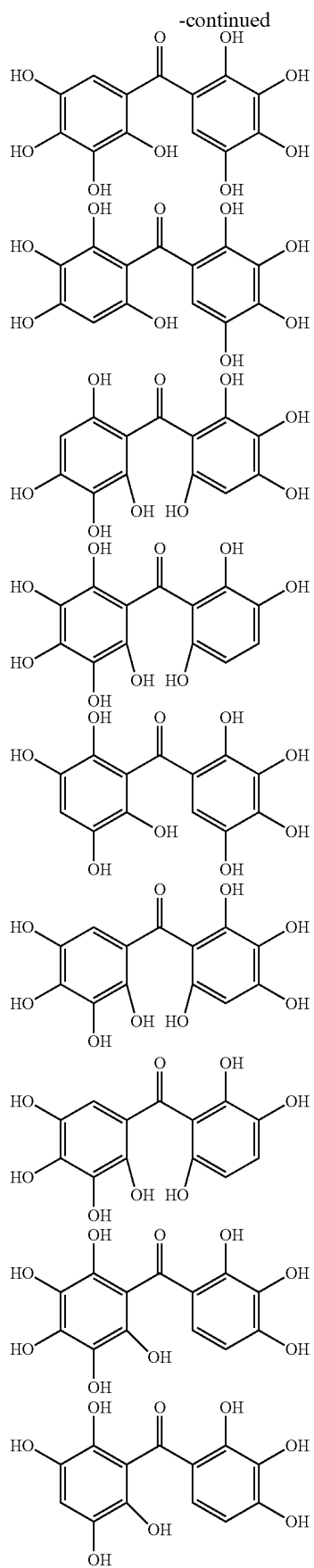
-continued
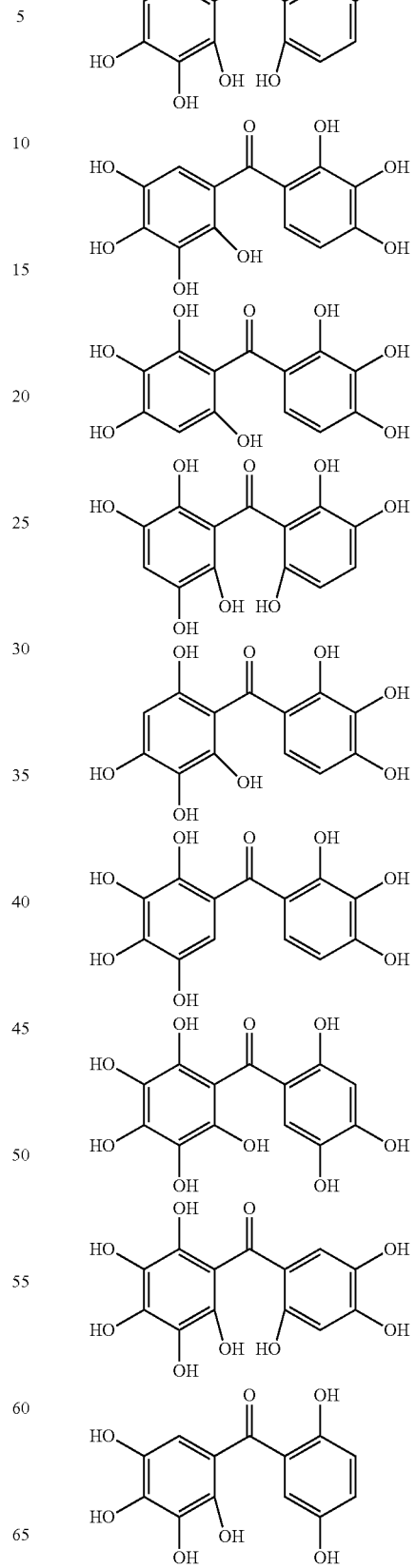

-continued
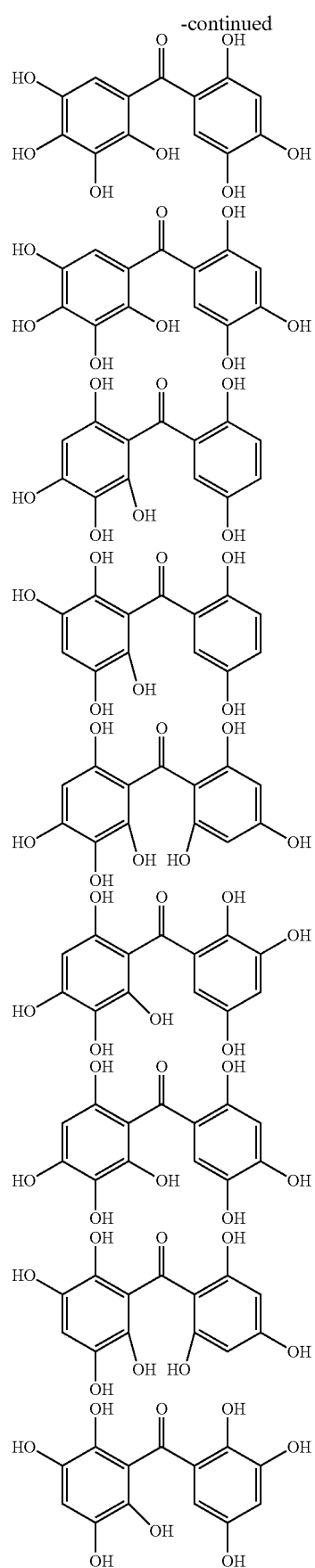
-continued
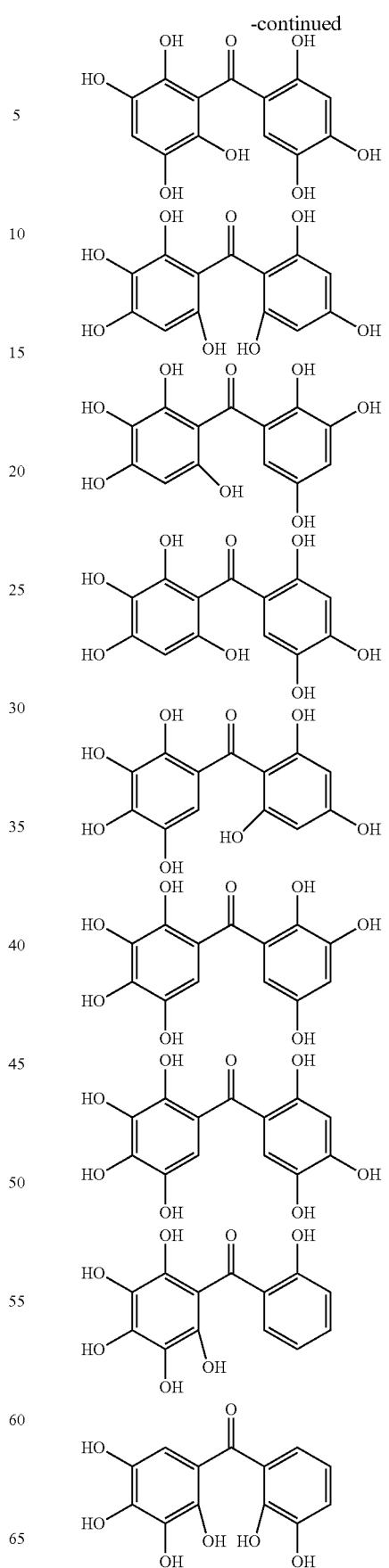

-continued
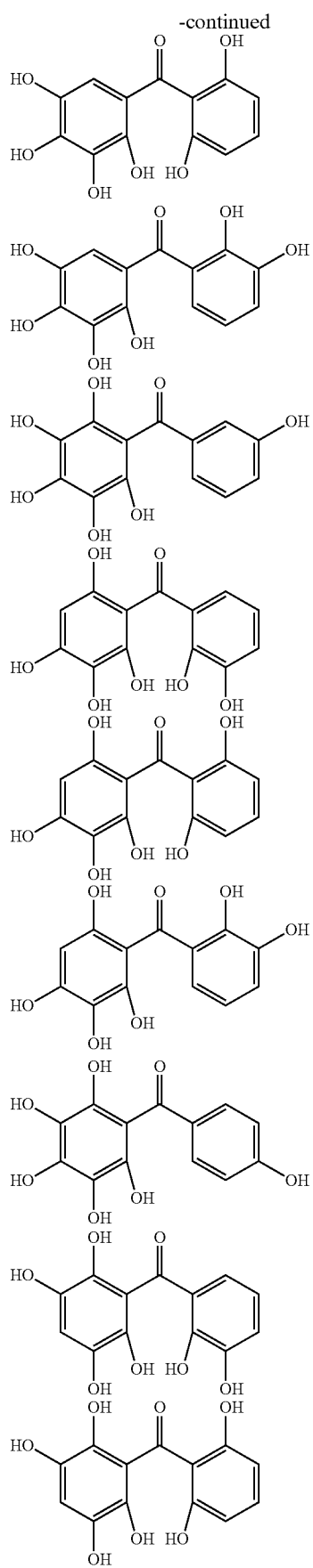
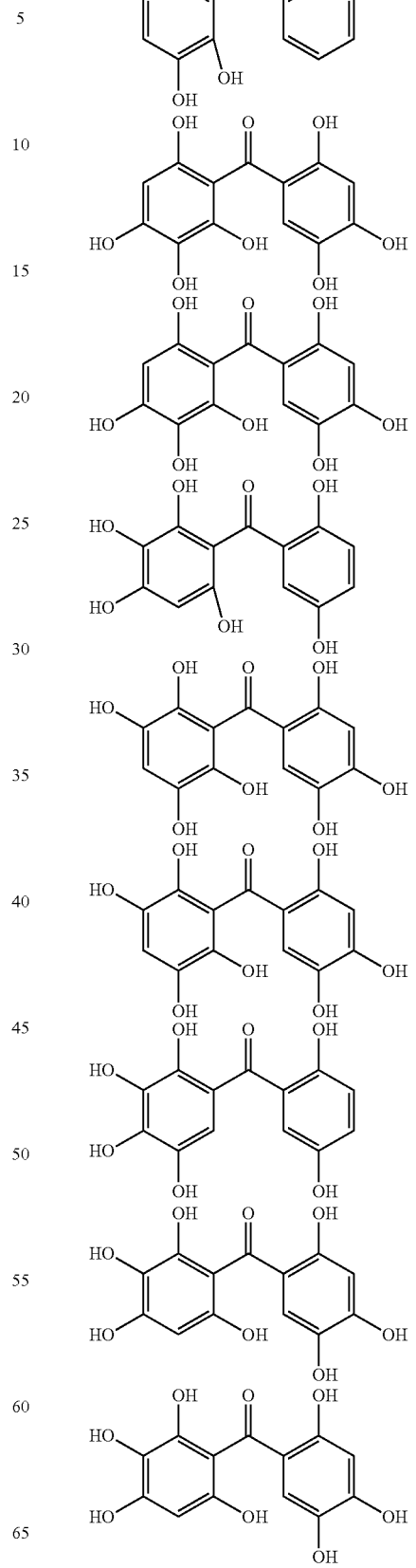

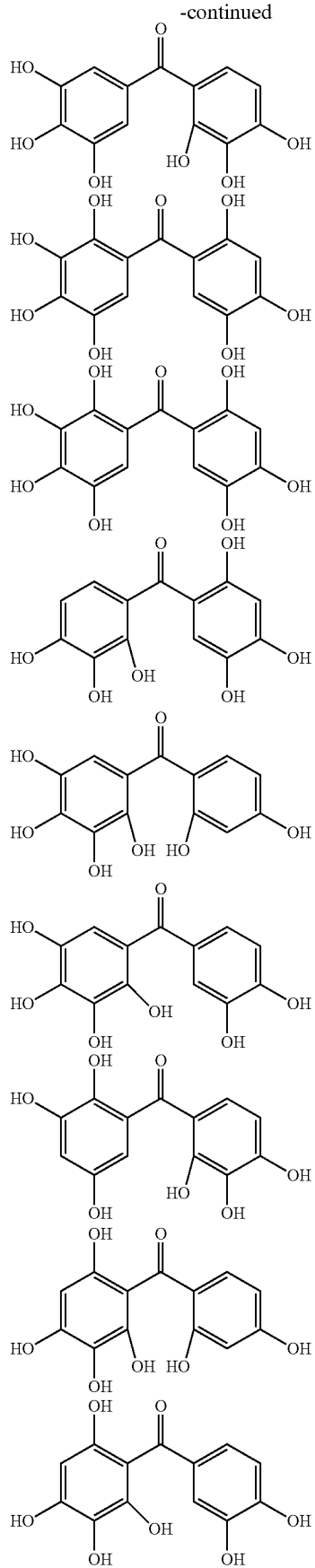
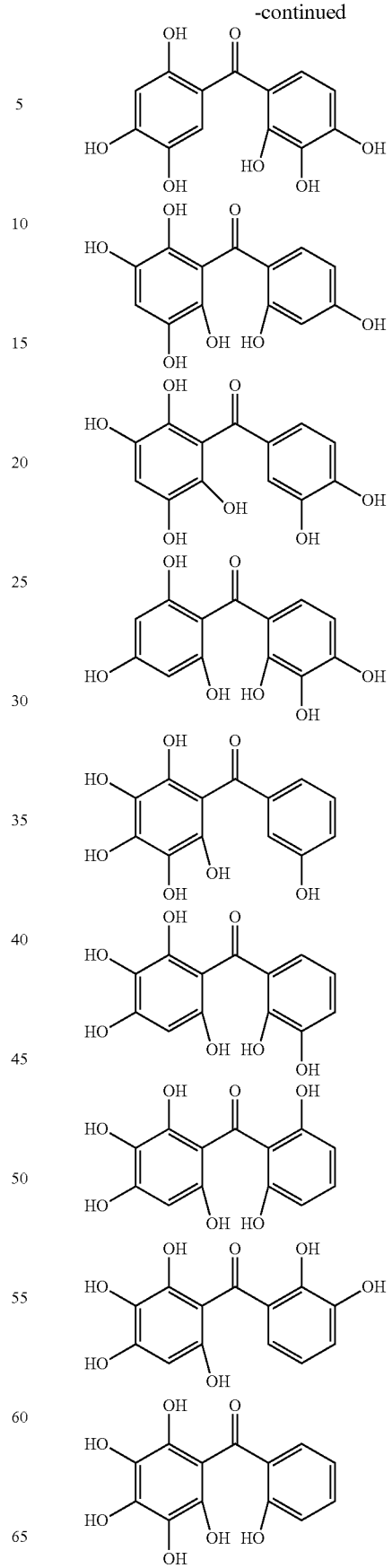

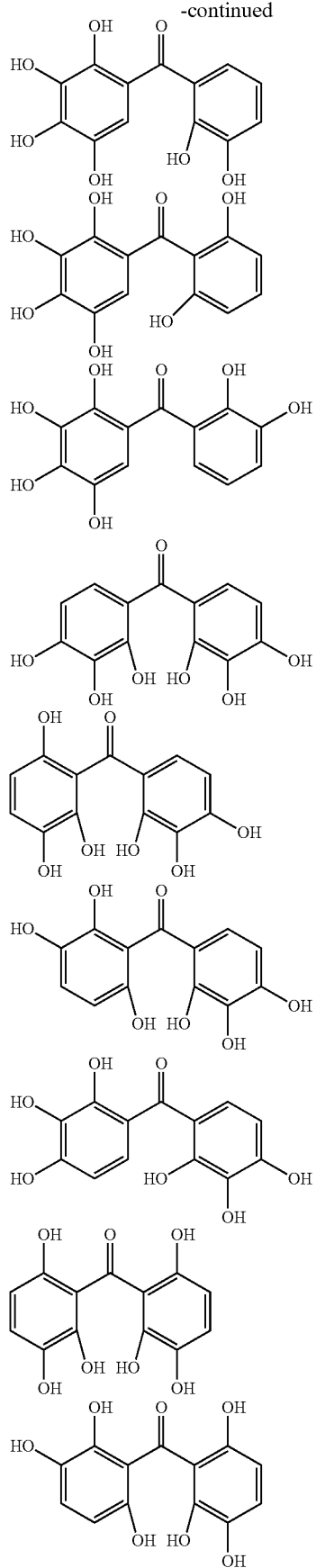
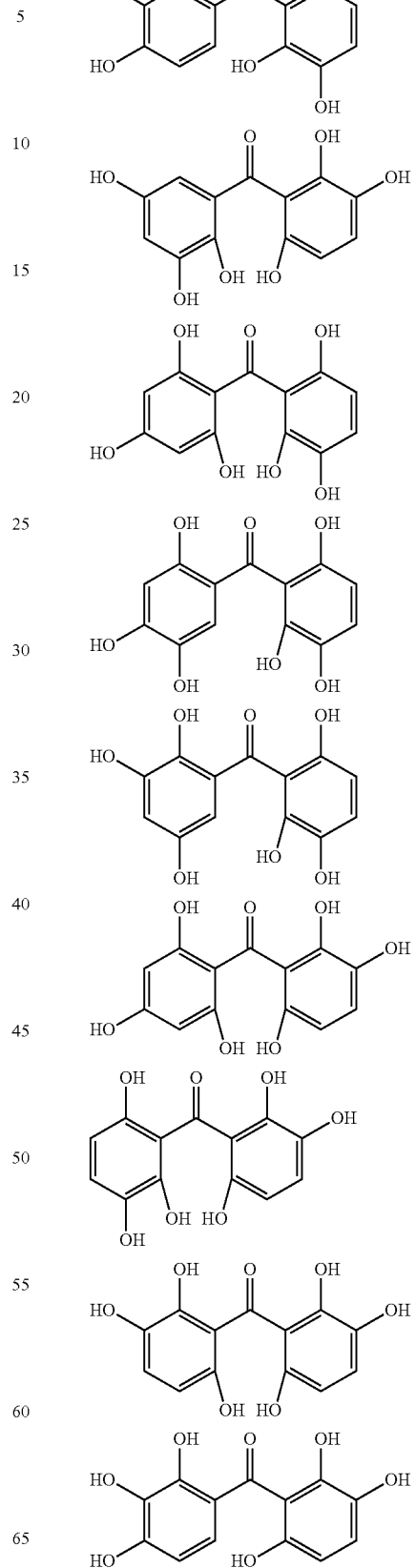

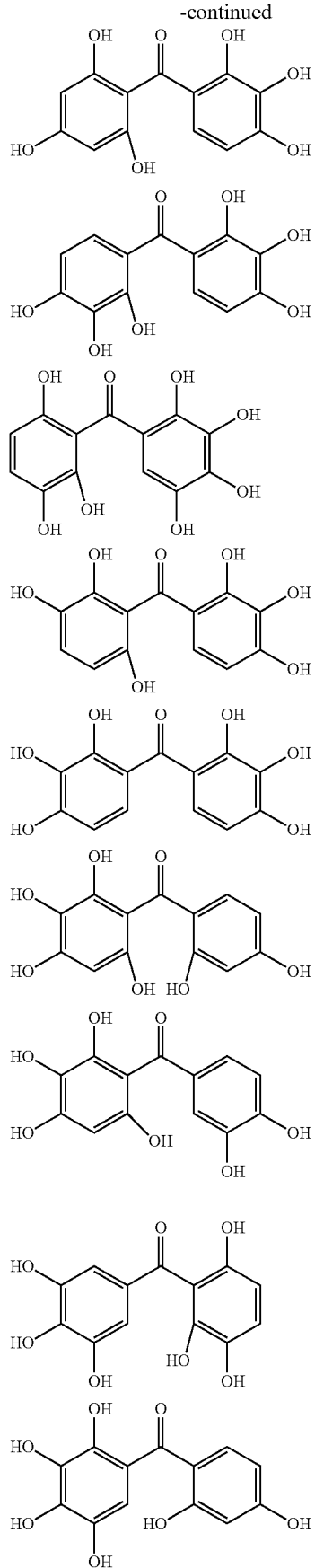
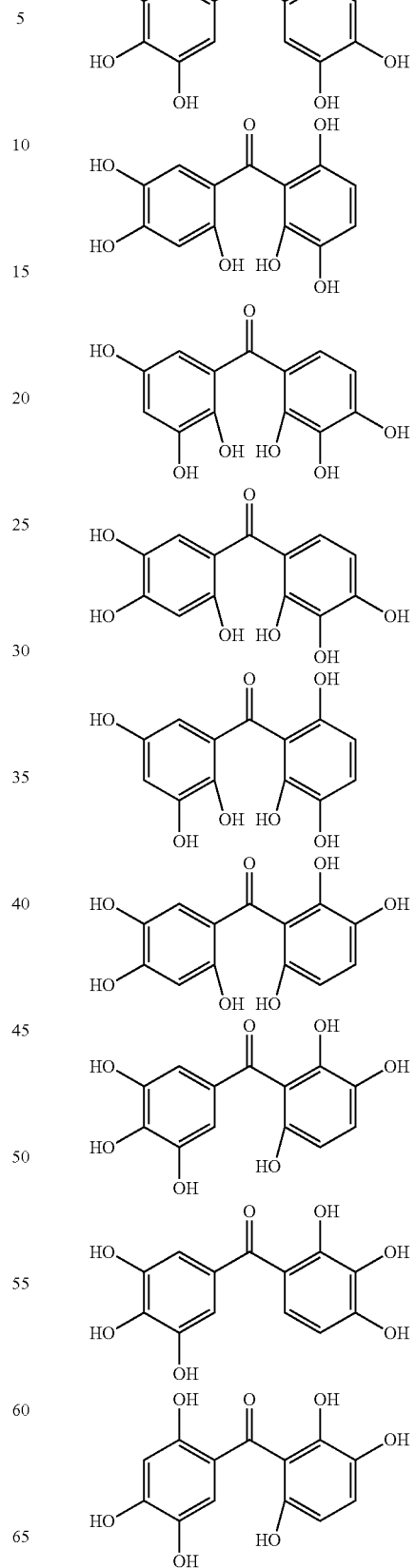

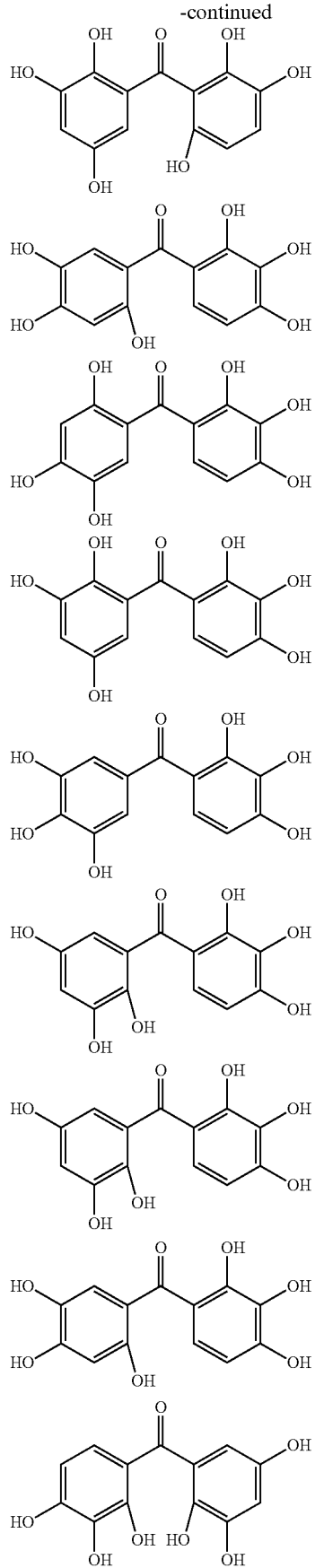
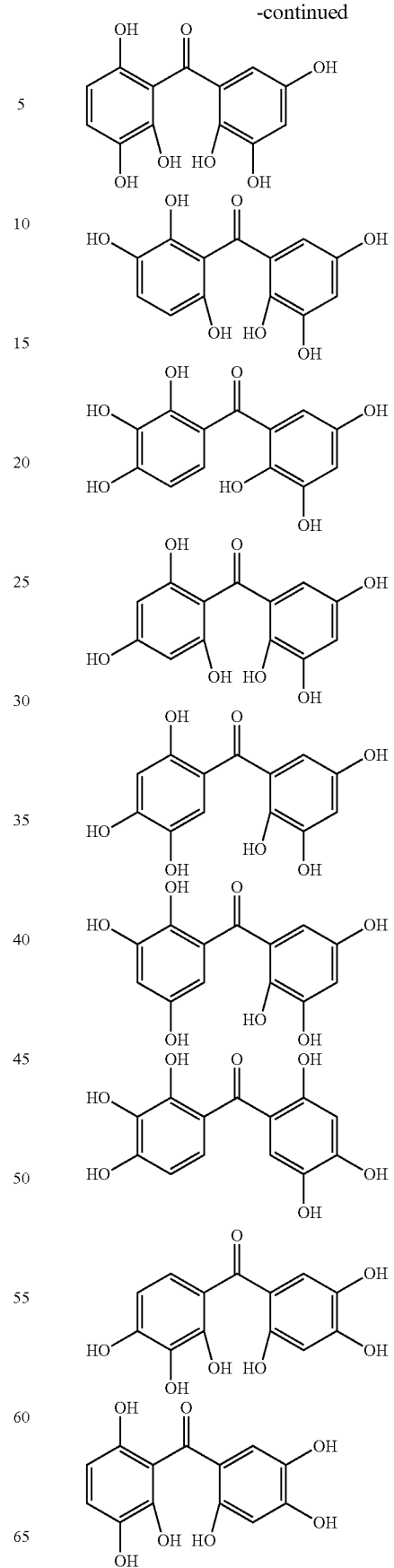

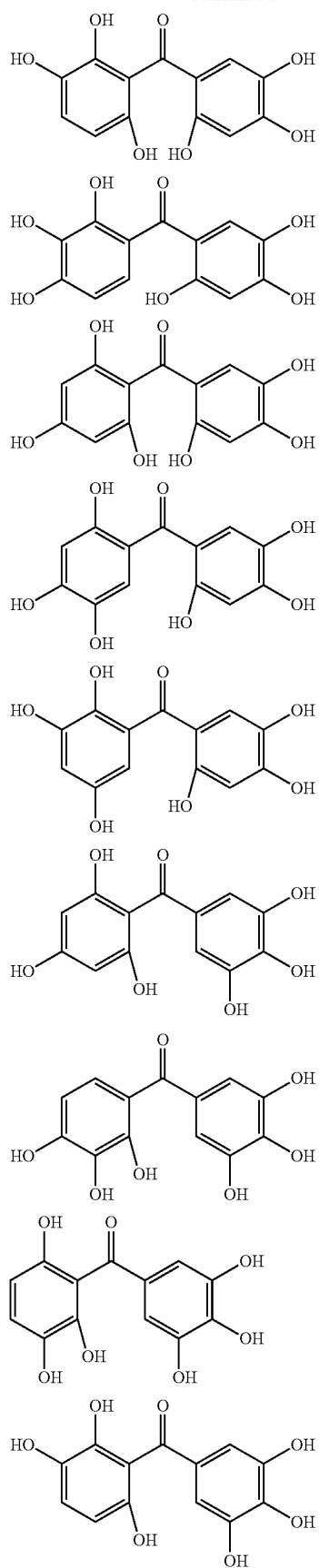
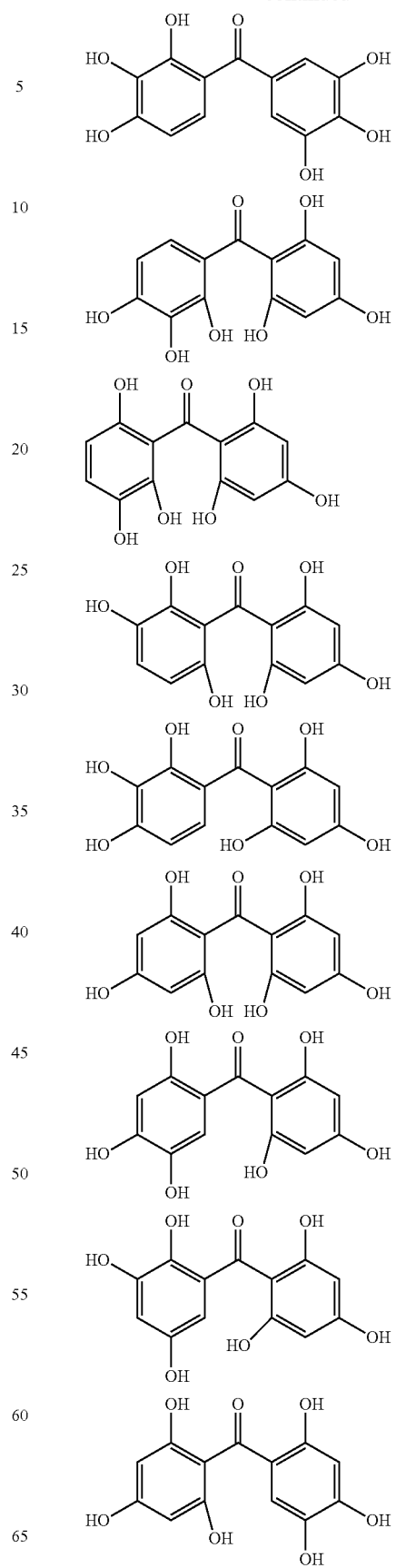

-continued
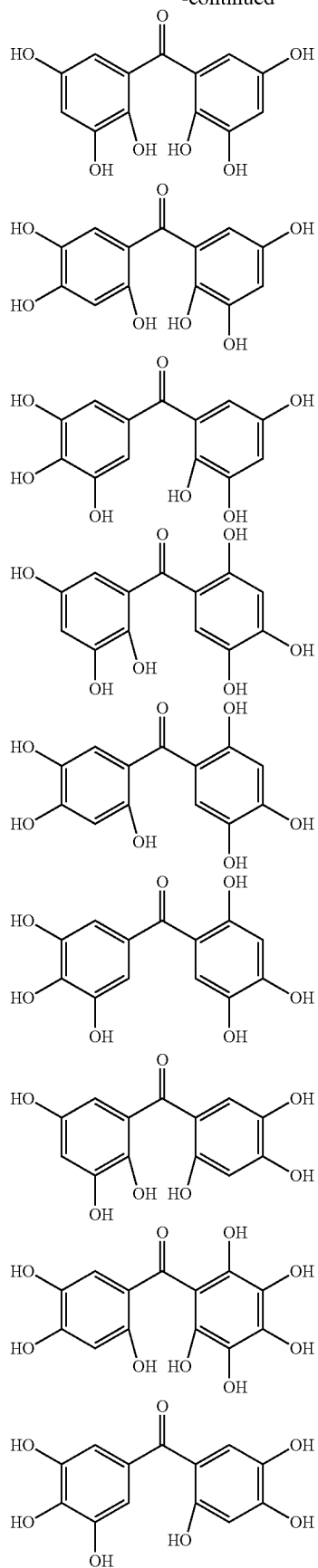
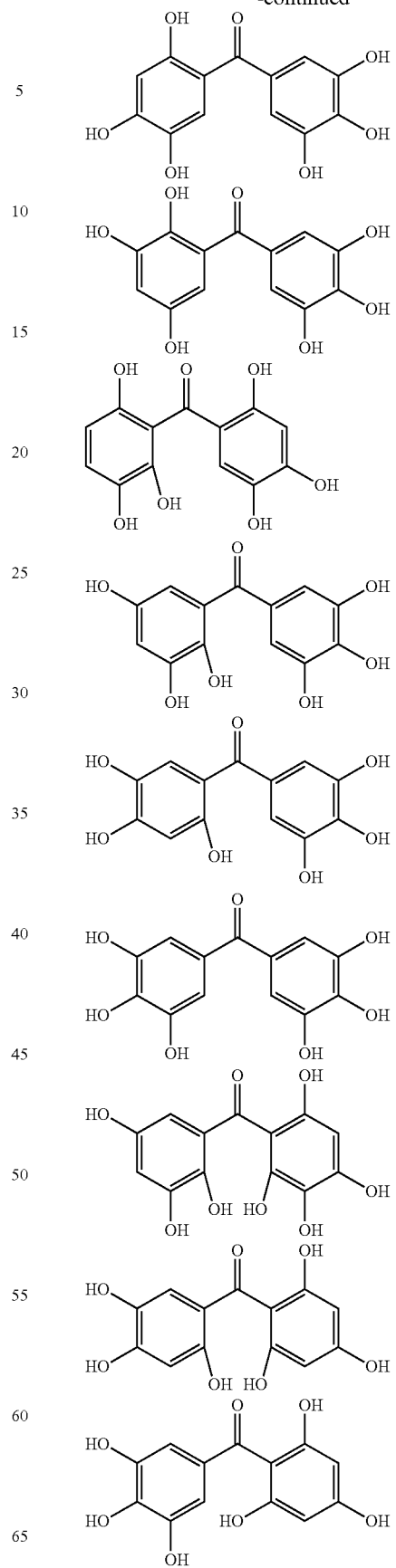

-continued
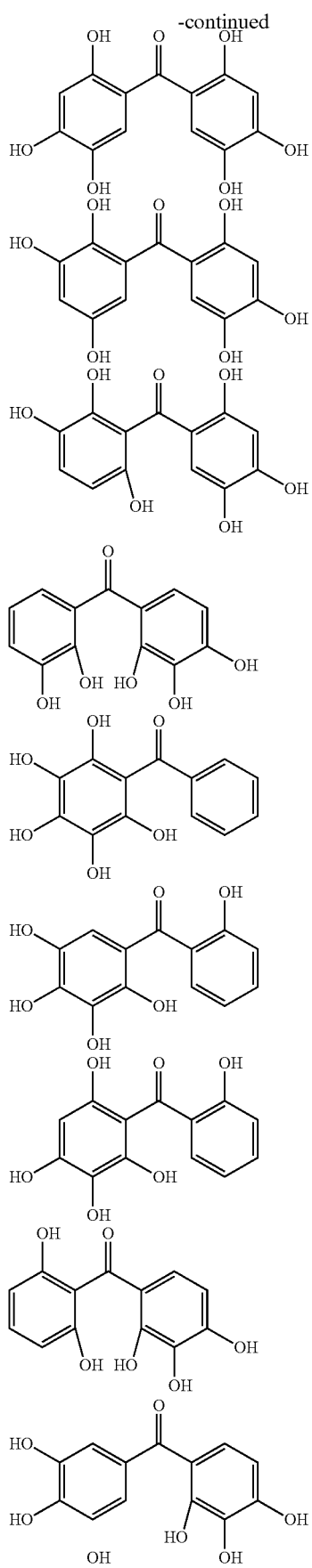
-continued
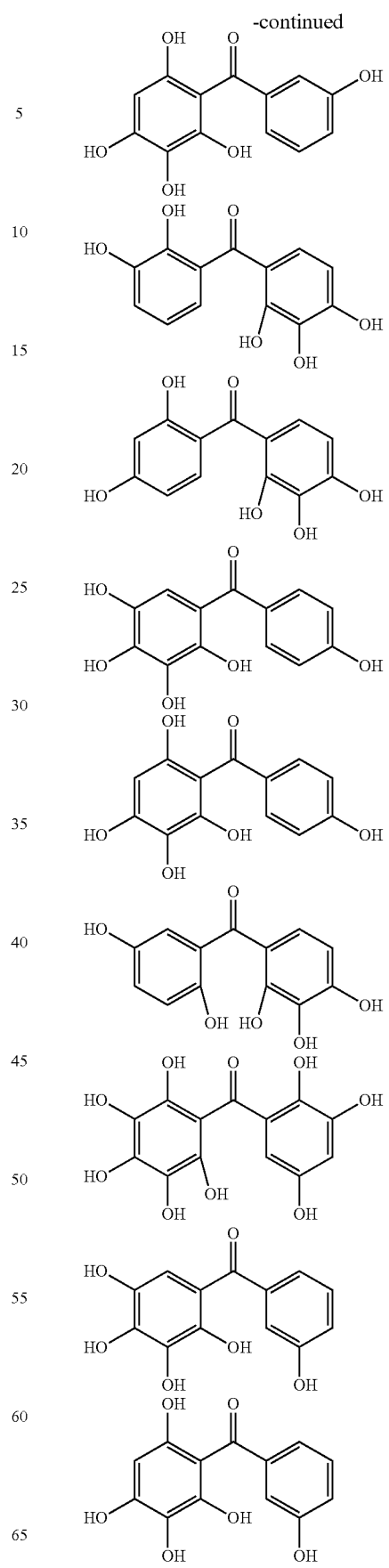

-continued
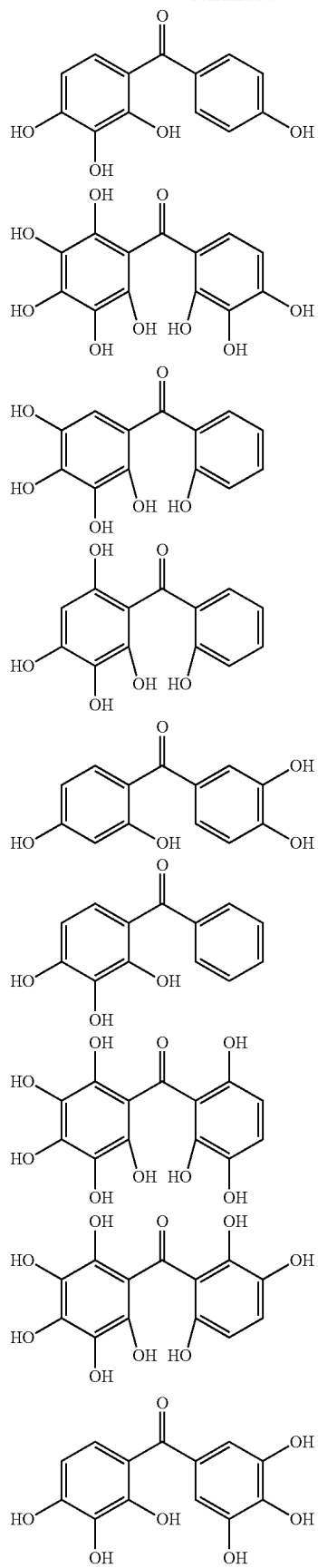
-continued
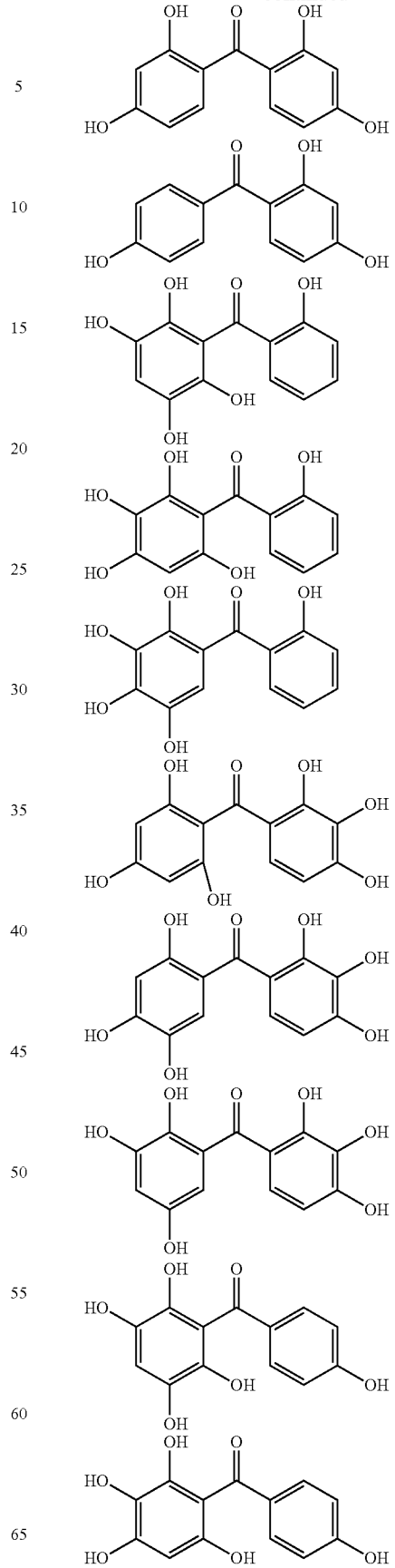

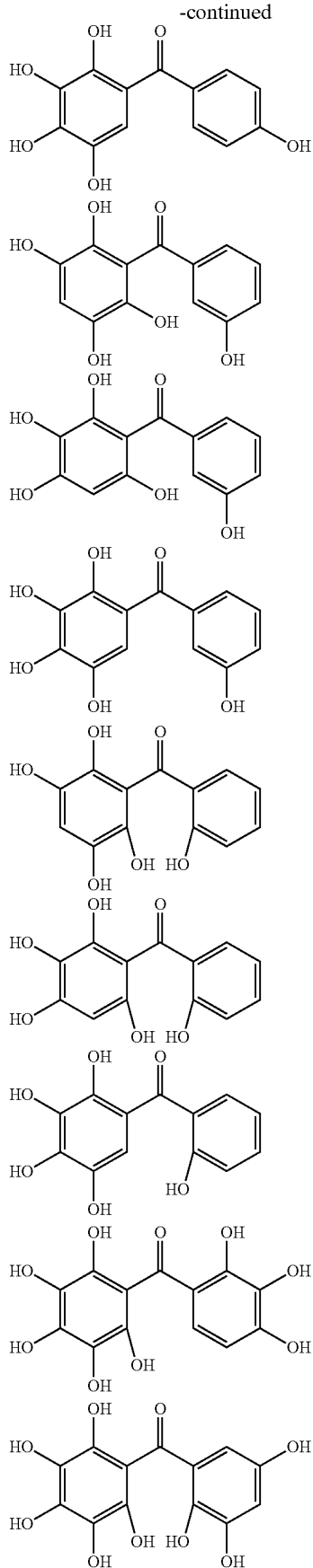

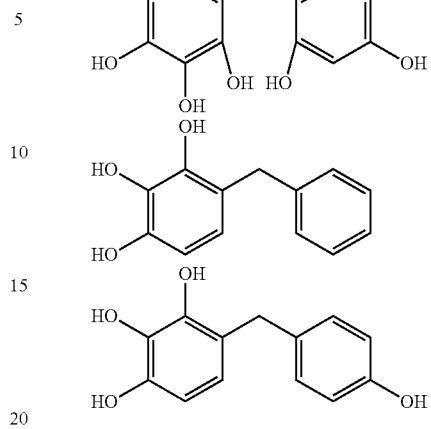

Among the compounds of Formula (1a), preferred are, for example, 2,3,3',4,4',5'-hexahydroxybenzophenone, 2,2',4,4'-tetrahydroxybenzophenone, 2,3,4,4'-tetrahydroxybenzophenone, 2,3,4-trihydroxydiphenylmethane, and 2,3,4,4'-tetrahydroxydiphenylmethane, since they are readily available. Among the compounds of Formula (1a), a benzophenone derivative having a plurality of phenolic hydroxy groups is more preferred in view of an improvement in resistance against an aqueous hydrogen peroxide solution.

Examples of the compound of Formula (1b) include compounds of the following Formulae (1b-A) to (1b-P).

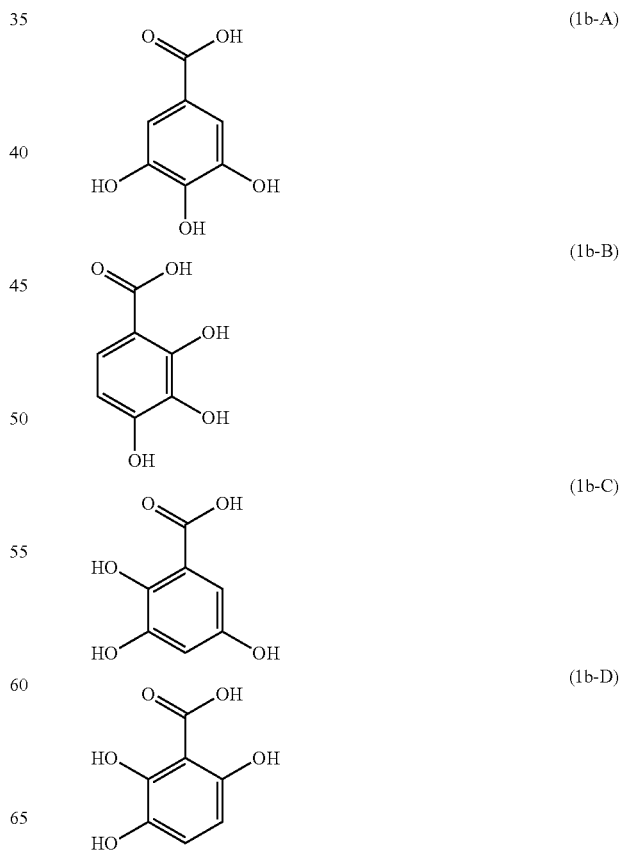

(1b-E) 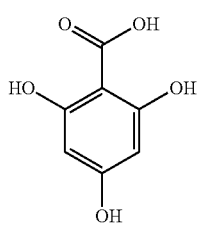

(1b-F) 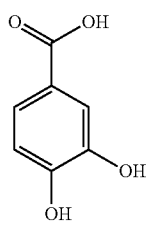

(1b-G) 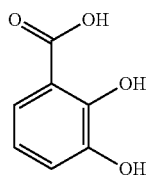

(1b-H) 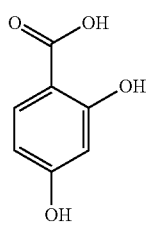

(1b-I) 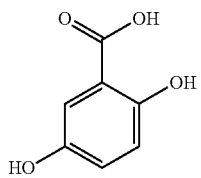

(1b-J) 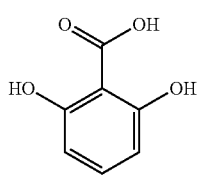

(1b-K) 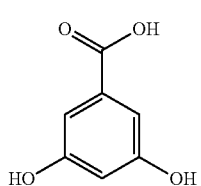

(1b-L) 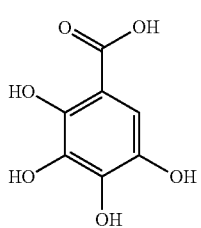

(1b-M) 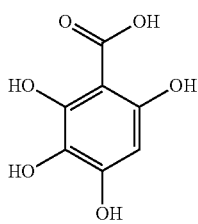

(1b-N) 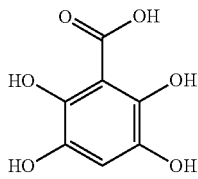

(1b-O) 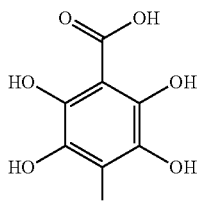

(1b-P) 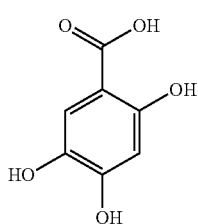

Examples of the compound of Formula (1c) include compounds of the following Formulae (1c-A), (1c-B), and (1c-C). When $R^1$, $R^2$, $R^3$, and $R^4$ in Formula (1c) are each a $C_{1-10}$ hydrocarbon group, examples of the $C_{1-10}$ hydrocarbon group include alkyl groups, such as methyl group, ethyl group, and isopropyl group, alkenyl groups, such as vinyl group and allyl group, alkylidene groups, such as ethylidene group and isopropylidene group, and allylidene group. When $R^1$, $R^2$, $R^3$, and $R^4$ are each a $C_{6-20}$ aryl group, examples of the $C_{6-20}$ aryl group include phenyl group, biphenyl group, naphthyl group, anthryl group, and phenanthryl group.

(1c-A) 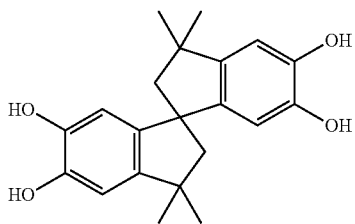

(1c-B) 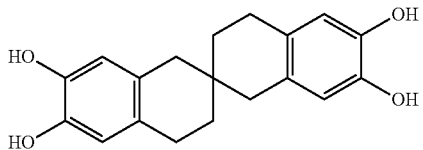

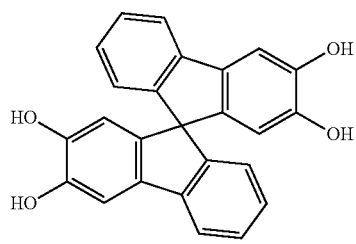
(1c-C)

The protective film-forming composition of the present invention contains the compound of Formula (1a), (1b), or (1c) in an amount of, for example, 0.01% by mass to 80% by mass, preferably 0.1% by mass to 75% by mass, relative to the amount of the aforementioned resin. When the amount of the compound of Formula (1a), (1b), or (1c) is less than 0.01% by mass, the effects of the present invention may fail to be achieved. Meanwhile, when the amount of the compound of Formula (1a), (1b), or (1c) exceeds 80% by mass, the protective film-forming composition may be difficult to uniformly apply onto a substrate.

[Crosslinking Agent]

The protective film-forming composition of the present invention contains a crosslinking agent as an essential component. The crosslinking agent is preferably a crosslinkable compound having at least two crosslinkable substituents; for example, a melamine compound, substituted urea compound, or phenolic compound having a crosslinkable substituent such as a methylol group or a methoxymethyl group. Examples of the melamine compound and the substituted urea compound include tetramethoxymethyl glycoluril, tetrabutoxymethyl glycoluril, hexamethoxymethylmelamine, hexabutoxymethylmelamine, tetramethoxymethylbenzoguanamine, tetrabutoxymethylbenzoguanamine, tetramethoxymethylurea, tetrabutoxymethylurea, and tetramethoxymethylthiourea. Examples of the phenolic compound include compounds of the following Formulae (3-1) to (3-28). "Me" in the following formulae represents a methyl group.

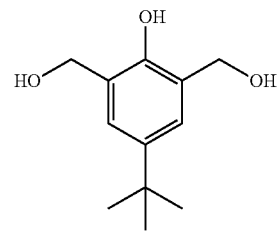
(3-3)

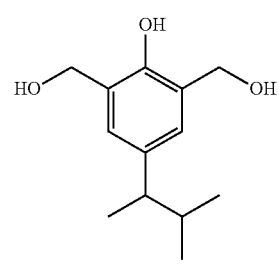
(3-4)

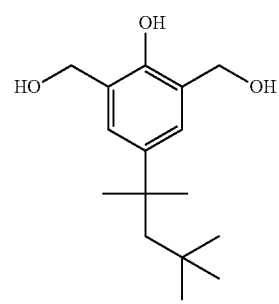
(3-5)

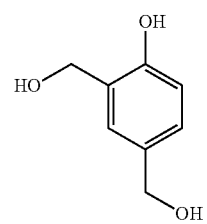
(3-6)

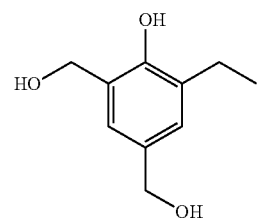
(3-7)

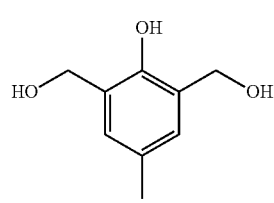
(3-1)

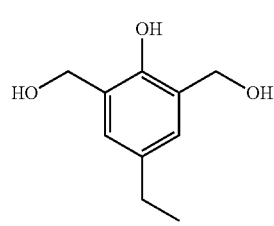
(3-2)

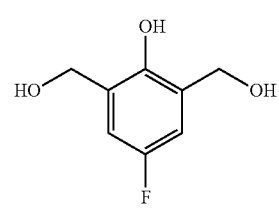
(3-8)

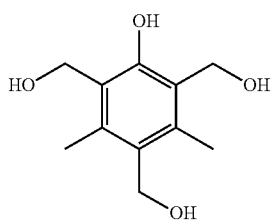 (3-9)
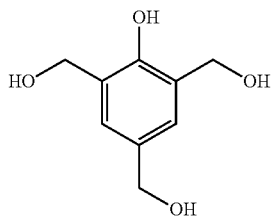 (3-10)
(3-11)
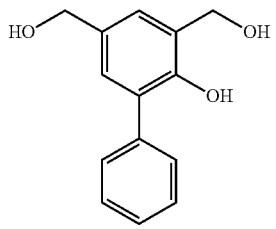
(3-12)
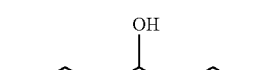
(3-13)
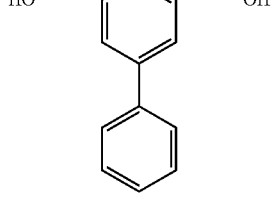
(3-14)
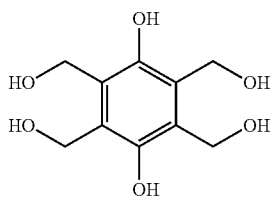
(3-15)
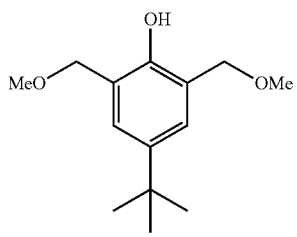
(3-16)
(3-17)
(3-18)
(3-19)
(3-20)
(3-21)
(3-22)
(3-23)
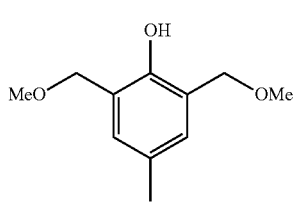

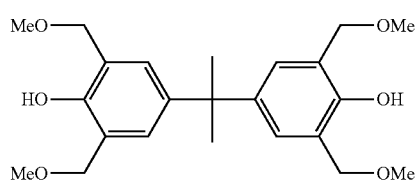

(3-24)

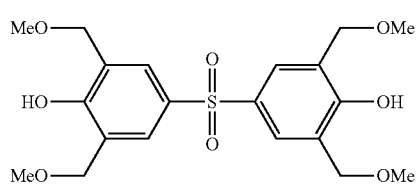

(3-25)

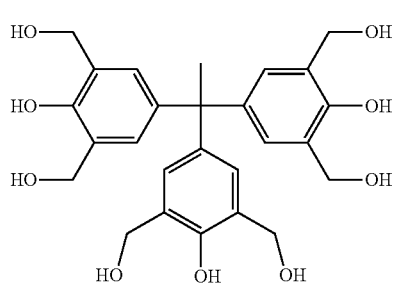

(3-26)

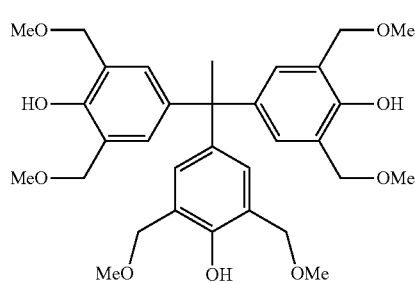

(3-27)

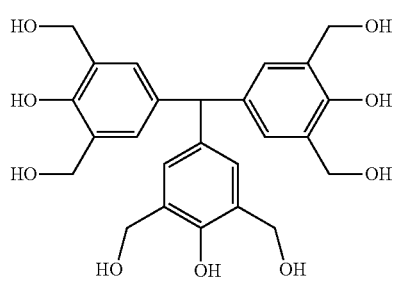

(3-28)

Among the aforementioned phenolic compounds, for example, the compound of Formula (3-23) can be obtained as trade name: TMOM-BP (available from Honshu Chemical Industry Co., Ltd.), and the compound of Formula (3-20) can be obtained as trade name: TM-BIP-A (available from ASAHI YUKIZAI CORPORATION).

These crosslinking agents may be contained alone or in combination of two or more species. Among the aforementioned crosslinking agents, particularly preferred are the compound of Formula (3-23), the compounds of Formulae (3-24), (3-25), and (3-20), and derivatives prepared by reaction between the crosslinkable substituents of these compounds and alcohols such as propylene glycol monomethyl ether, in view of an improvement in resistance against an aqueous hydrogen peroxide solution.

The protective film-forming composition of the present invention contains any of the aforementioned crosslinking agents in an amount of 5% by mass to 40% by mass, preferably 10% by mass to 30% by mass, relative to the amount of the resin. When the amount of the crosslinking agent is excessively small and excessively large, the resultant film may have insufficient resistance against a resist solvent.

[Crosslinking Catalyst]

The protective film-forming composition of the present invention contains a crosslinking catalyst (acid catalyst) that promotes a crosslinking reaction as an essential component. Examples of the crosslinking catalyst include sulfonic acid compounds and carboxylic acid compounds, such as pyridinium p-toluenesulfonate, pyridinium p-hydroxybenzenesulfonate, pyridinium trifluoromethanesulfonate, p-toluenesulfonic acid, p-hydroxybenzenesulfonic acid, trifluoromethanesulfonic acid, salicylic acid, camphorsulfonic acid, 5-sulfosalicylic acid, chlorobenzenesulfonic acid, methyl 4-phenolsulfonate, benzenesulfonic acid, naphthalenesulfonic acid, citric acid, and benzoic acid; quaternary ammonium salts of trifluoromethanesulfonic acid, such as K-PURE [registered trademark] TAG2689, TAG2690, TAG2678, and CXC-1614 (available from King Industries Inc.); and thermal acid generators, such as 2,4,4,6-tetrabromocyclohexadienone, benzoin tosylate, 2-nitrobenzyl tosylate, and other organic sulfonic acid alkyl esters. These acid catalysts may be contained alone or in combination of two or more species. Among the aforementioned crosslinking catalysts, particularly preferred are pyridinium trifluoromethanesulfonate and TAG2689, which generate trifluoromethanesulfonic acid, in view of an improvement in resistance against an aqueous hydrogen peroxide solution.

The protective film-forming composition of the present invention contains any of the aforementioned crosslinking catalysts in an amount of, for example, 1% by mass to 30% by mass, preferably 5% by mass to 15% by mass, relative to the amount of the crosslinking agent.

[Solvent]

The protective film-forming composition of the present invention can be prepared by dissolving the aforementioned components in a solvent, and is used in the form of a homogeneous solution. Examples of the solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monoethyl ether, propylene glycol monomethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used alone or in combination of two or more species.

[Other Components]

The protective film-forming composition of the present invention may contain a surfactant as an optional component for improving the applicability of the composition to a semiconductor substrate. Examples of the surfactant include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylaryl ethers, such as polyoxyethylene octylphenyl ether and polyoxyethylene nonylphenyl ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as EFTOP [registered trademark] EF301, EF303, and EF352 (available from Mitsubishi Materials Electronic Chemicals Co., Ltd.), MEGAFAC [registered trademark] F171, F173, R-30, R-30N, R-40, and R-40-LM (available from DIC Corporation), Fluorad FC430 and FC431 (available from Sumitomo 3M Limited), Asahi Guard [registered trademark] AG710, and SURFLON [registered trademark] S-382, SC101, SC102, SC103, SC104, SC105, and SC106 (available from Asahi Glass Co., Ltd.); and Organosiloxane Polymer KP341 (available from Shin-Etsu Chemical Co., Ltd.). These surfactants may be used alone or in combination of two or more species. When the protective film-forming composition of the present invention contains a surfactant, the amount of the surfactant is, for example, 0.005% by mass to 10% by mass, preferably 0.01% by mass to 5% by mass, relative to the amount of the resin.

The thus-prepared protective film-forming composition is preferably used after filtration with a filter having a pore size of, for example, 0.2 µm or 0.1 µm and/or a filter having a pore size of 0.01 µm.

Next will be described a pattern forming method using the protective film-forming composition of the present invention.

Examples of the semiconductor substrate to which the protective film-forming composition of the present invention is applied include a silicon substrate, a germanium substrate, and compound semiconductor wafers, such as gallium arsenide, indium phosphide, gallium nitride, indium nitride, and aluminum nitride. In the case of use of a semiconductor substrate having an inorganic film on its surface, the inorganic film is formed by, for example, ALD (atomic layer deposition), CVD (chemical vapor deposition), reactive sputtering, ion plating, vacuum vapor deposition, or spin coating (spin on glass: SOG). Examples of the inorganic film include polysilicon film, silicon oxide film, silicon nitride film, BPSG (boro-phospho silicate glass) film, titanium nitride film, titanium oxide nitride film, tungsten film, gallium nitride film, and gallium arsenide film.

The protective film-forming composition of the present invention is applied onto such a semiconductor substrate by an appropriate application method using, for example, a spinner or a coater. Thereafter, the composition is baked by heating means (e.g., a hot plate), to thereby form a protective film. The baking is performed under appropriately determined conditions; i.e., a baking temperature of 100° C. to 400° C. and a baking time of 0.3 minutes to 60 minutes. Preferably, the baking temperature is 120° C. to 350° C. and the baking time is 0.5 minutes to 30 minutes, and more preferably, the baking temperature is 150° C. to 300° C. and the baking time is 0.8 minutes to 10 minutes. The thus-formed protective film has a thickness of, for example, 0.001 µm to 10 µm, preferably 0.002 µm to 1 µm, more preferably 0.005 µm to 0.5 µm. When the baking temperature is below the aforementioned range, crosslinking proceeds insufficiently, and the resultant protective film may have insufficient resistance against a resist solvent or an aqueous hydrogen peroxide solution. Meanwhile, when the baking temperature is above the aforementioned range, the protective film may decompose by heat.

Subsequently, a resist pattern is formed on the protective film. The resist pattern can be formed by a common method; i.e., a method involving application of a photoresist solution onto the protective film, prebaking, light exposure, post exposure bake abbreviated as "PEB" (if necessary), development, and rinsing. No particular limitation is imposed on the photoresist solution used for formation of the resist pattern, so long as the photoresist is sensitive to light used for exposure. The photoresist may be a positive photoresist. Examples of the photoresist include a chemically amplified photoresist formed of a binder having a group that decomposes with an acid to thereby increase an alkali dissolution rate and a photoacid generator; a chemically amplified photoresist formed of a low-molecular-weight compound that decomposes with an acid to thereby increase the alkali dissolution rate of the photoresist, an alkali-soluble binder, and a photoacid generator; a chemically amplified photoresist formed of a binder having a group that decomposes with an acid to thereby increase an alkali dissolution rate, a low-molecular-weight compound that decomposes with an acid to thereby increase the alkali dissolution rate of the photoresist, and a photoacid generator; and a DNQ-novolac-type non-chemically amplified photoresist utilizing the difference in alkali dissolution rate between an exposed portion and an unexposed portion. Specific examples of the photoresist include trade name: PAR710, available from Sumitomo Chemical Company, Limited, trade name: TDUR-P3435LP and THMR-iP1800, available from TOKYO OHKA KOGYO Co., Ltd., and trade name: SEPR430, available from Shin-Etsu Chemical Co., Ltd. A negative photoresist may be used instead of the positive photoresist.

The aforementioned light exposure is performed through a mask (reticle) for forming a predetermined pattern. The light exposure involves the use of, for example, i-rays, KrF excimer laser, ArF excimer laser, EUV (extreme-ultraviolet rays), or EB (electron beams). The aforementioned development is performed with an alkaline developer under appropriately determined conditions; i.e., a development temperature of 5° C. to 50° C. and a development time of 10 seconds to 300 seconds. Example of the alkaline developer include alkaline aqueous solutions, for example, aqueous solutions of alkali metal hydroxides, such as potassium hydroxide and sodium hydroxide; aqueous solutions of quaternary ammonium hydroxides, such as tetramethylammonium hydroxide, tetraethylammonium hydroxide, and choline; and aqueous solutions of amines, such as ethanolamine, propylamine, and ethylenediamine. Such a developer may also contain, for example, a surfactant. The development may be performed with an organic solvent (e.g., butyl acetate) instead of an alkaline developer. In such a case, a portion of the photoresist where the alkali dissolution rate is not increased may be developed.

Subsequently, the protective film is dry-etched with the thus-formed resist pattern serving as a mask. In this case, when the inorganic film is formed on the surface of the semiconductor substrate used, the surface of the inorganic film is exposed, whereas when the inorganic film is not formed on the surface of the semiconductor substrate used, the surface of the semiconductor substrate is exposed.

Thereafter, the dry-etched protective film (and also the resist pattern if it remains on the protective film) is used as a mask, and wet etching is performed with an aqueous hydrogen peroxide solution, to thereby form a desired pattern. Examples of the chemical used for the wet etching include a basic aqueous hydrogen peroxide solution prepared by mixing of aqueous hydrogen peroxide with a basic substance; for example, ammonia, sodium hydroxide, potassium hydroxide, sodium cyanide, potassium cyanide, or an organic amine (e.g., triethanolamine) so as to have a basic pH; and an acidic aqueous hydrogen peroxide solution prepared by mixing of aqueous hydrogen peroxide with an inorganic acid, such as hydrochloric acid or sulfuric acid. Alternatively, the chemical used for the wet etching may be a mixture that can achieve a basic pH; for example, a mixture of urea and aqueous hydrogen peroxide for generating ammonia through thermal decomposition of urea by heating, to thereby achieve a basic pH finally. Each of the basic aqueous hydrogen peroxide solution and the acidic aqueous hydrogen peroxide solution is used at a temperature of preferably 25° C. to 90° C., more preferably 40° C. to 80° C. The wet etching time is preferably 0.5 minutes to 30 minutes, more preferably 1 minute to 20 minutes.

EXAMPLES

The weight average molecular weights of the resins (polymers) prepared in Synthesis Examples 1 to 6 described hereinbelow were measured by gel permeation chromatography (hereinafter abbreviated as "GPC"). The measurement was performed with a GPC apparatus (available from TOSOH CORPORATION) under the following measuring conditions.
GPC column: Shodex KF803L, Shodex KF802, and Shodex KF801 [registered trademark] (available from Showa Denko K.K.)
Column temperature: 40° C.
Solvent: tetrahydrofuran (THF)
Flow rate: 1.0 ml/min
Standard sample: polystyrene (available from TOSOH CORPORATION)

Synthesis Example 1

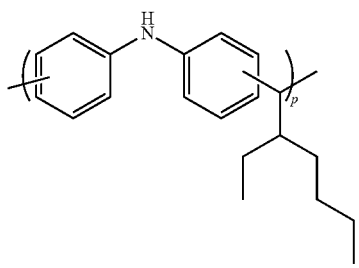

(4-1)

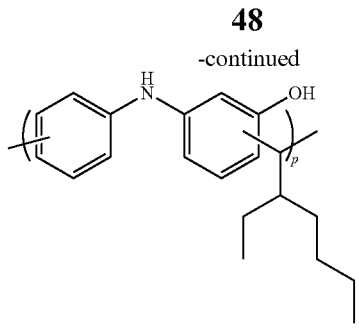

A two-necked flask was charged with 6.84 g of diphenylamine (available from Kanto Chemical Co., Inc.), 7.49 g of 3-hydroxydiphenylamine (available from Tokyo Chemical Industry Co., Ltd.), 10.36 g of ethylhexylaldehyde (available from Tokyo Chemical Industry Co., Ltd.), 25.0 g of propylene glycol monomethyl ether acetate, and 0.31 g of methanesulfonic acid (available from Tokyo Chemical Industry Co., Ltd.). Thereafter, the resultant mixture was heated to 120° C. in a nitrogen atmosphere and refluxed with stirring for about five hours. After completion of reaction, the reaction mixture was diluted with 20 g of tetrahydrofuran (available from Kanto Chemical Co., Inc.) and then added dropwise to a solvent mixture of methanol (available from Kanto Chemical Co., Inc.), ultrapure water, and 30% by mass aqueous ammonia (available from Kanto Chemical Co., Inc.) for reprecipitation. The resultant precipitate was subjected to suction filtration, and then the residue was dried under reduced pressure at 60° C. overnight, to thereby prepare 23.8 g of a resin. The resultant resin was a polymer having two types of repeating units of Formula (4-1) (wherein p and q are each independently a number of repeating units of 2 to 500) and was found to have a weight average molecular weight Mw of 10,200 as measured by GPC in terms of polystyrene.

Synthesis Example 2

(4-2)

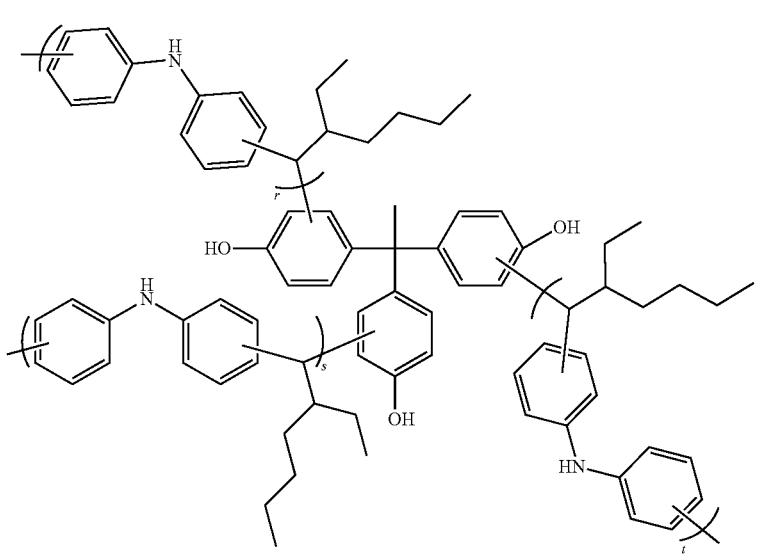

A two-necked flask was charged with 9.90 g of diphenylamine (available from Kanto Chemical Co., Inc.), 10.00 g of ethylhexylaldehyde (available from Tokyo Chemical Industry Co., Ltd.), 5.97 g of 1,1,1-tris(4-hydroxyphenyl)ethane (available from Tokyo Chemical Industry Co., Ltd.), 23.4 g of propylene glycol monomethyl ether acetate, and 1.50 g of methanesulfonic acid (available from Tokyo Chemical Industry Co., Ltd.). Thereafter, the resultant mixture was heated to 150° C. in a nitrogen atmosphere and refluxed with stirring for about 18 hours. After completion of reaction, the reaction mixture was diluted with 48.8 g of propylene glycol monomethyl ether acetate, and then the resultant polymer solution was added dropwise to a solvent mixture of methanol (available from Kanto Chemical Co., Inc.)/water=70/30 (Vol/Vol) for reprecipitation. The resultant precipitate was subjected to suction filtration, and then the residue was dried under reduced pressure at 60° C. overnight, to thereby prepare 21.6 g of a resin. The resultant resin was a branched polymer of Formula (4-2) (wherein r, s, and t are each independently a number of repeating units so as to satisfy the relation: 2≤r+s+t≤500, and r, s, or t may be 0) and was found to have a weight average molecular weight Mw of 2,300 as measured by GPC in terms of polystyrene.

Synthesis Example 3

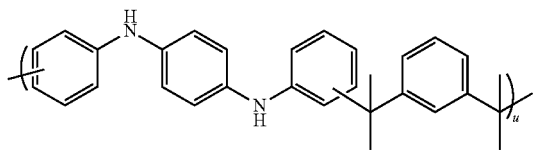

(4-3)

A 500-mL four-necked flask was charged with 37.33 g of α,α'-dihydroxy-1,3-diisopropylbenzene (available from Tokyo Chemical Industry Co., Ltd.), 50.00 g of N,N'-1,4-phenylenediamine (available from Tokyo Chemical Industry Co., Ltd.), 1.53 g of p-toluenesulfonic acid monohydrate (available from Tokyo Chemical Industry Co., Ltd.), and 207.3 g of propylene glycol monomethyl ether acetate. Thereafter, the resultant mixture was heated until reflux in a nitrogen atmosphere, and then stirred for about 16 hours. After completion of reaction, the reaction mixture was added to 1,600 g of methanol (available from Kanto Chemical Co., Inc.) for reprecipitation. The resultant precipitate was subjected to suction filtration, and then the residue was dried under reduced pressure at 50° C. for 16 hours, to thereby prepare 56.04 g of a resin. The resultant resin was a polymer having a repeating unit of Formula (4-3) (wherein u is a number of repeating units of 2 to 500) and was found to have a weight average molecular weight Mw of 2,700 as measured by GPC in terms of polystyrene.

Synthesis Example 4

An eggplant-shaped flask was charged with 10.00 g of an epoxy resin (trade name: EPICLON [registered trademark] HP-6000 (available from DIC Corporation)), 2.91 g of 4-heptyloxybenzoic acid (available from Tokyo Chemical Industry Co., Ltd.), 5.75 g of lauric acid (available from Tokyo Chemical Industry Co., Ltd.), 0.38 g of ethyltriphenylphosphonium bromide (available from Hokko Chemical Industry), and 44.41 g of propylene glycol monomethyl ether, and the resultant mixture was heated with stirring in a nitrogen atmosphere under reflux for 16 hours. To the resultant mixture were added 19.0 g of a cation-exchange resin (trade name: DOWEX [registered trademark] 550A, available from MUROMACHI TECHNOS CO., LTD.) and 19.0 g of an anion-exchange resin (trade name: Amberlite [registered trademark] 15JWET, available from ORGANO CORPORATION), and the mixture was subjected to ion-exchange treatment at room temperature for four hours. The ion-exchange resins were then separated to thereby prepare a resin solution. The resin contained in the resin solution was a polymer, and the polymer was found to have a weight average molecular weight Mw of 1,500 as measured by GPC in terms of polystyrene.

Synthesis Example 5

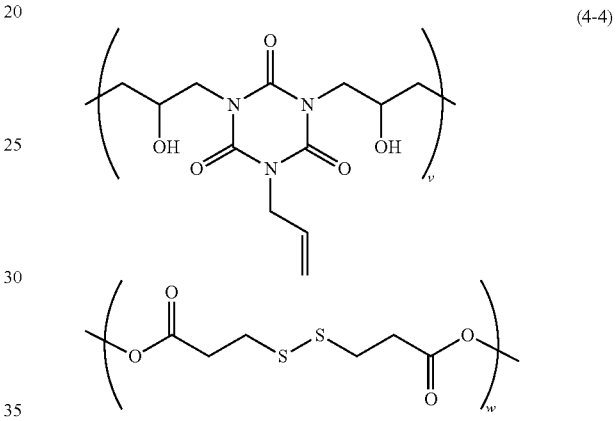

(4-4)

Firstly, 10.00 g of monoallyldiglycidylisocyanuric acid (available from SHIKOKU CHEMICALS CORPORATION), 7.48 g of 3,3'-dithiodipropionic acid (available from Tokyo Chemical Industry Co., Ltd.), and 0.66 g of ethyltriphenylphosphonium bromide (available from Hokko Chemical Industry) were dissolved in 72.94 g of propylene glycol monomethyl ether, and then reaction was allowed to proceed at 125° C. for four hours, to thereby prepare a resin solution. The resin contained in the resin solution was a polymer having two types of repeating units of Formula (4-4) (wherein v and w are each independently a number of repeating units of 2 to 500) and was found to have a weight average molecular weight of 4,800 as measured by GPC analysis in terms of standard polystyrene.

Synthesis Example 6

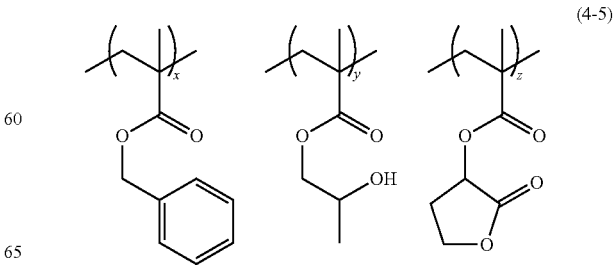

(4-5)

Firstly, 2.04 g (34 mol %) of benzyl methacrylate (available from Tokyo Chemical Industry Co., Ltd.), 1.62 g (33 mol %) of 2-hydroxypropyl methacrylate (available from Tokyo Chemical Industry Co., Ltd.), 1.91 g (33 mol %) of γ-butyrolactone methacrylate (available from OSAKA ORGANIC CHEMICAL INDUSTRY LTD.), and 0.30 g of azoisobutyronitrile (available from Tokyo Chemical Industry Co., Ltd.) were dissolved in 11.74 g of propylene glycol monomethyl ether. The resultant solution was slowly added dropwise to 11.74 g of propylene glycol monomethyl ether heated to 100° C. After completion of the dropwise addition, reaction was allowed to proceed at 100° C. for two hours, to thereby prepare a resin solution. The resin contained in the resin solution was a polymer having repeating units of Formula (4-5) (wherein x, y, and z are each independently a number of repeating units so as to satisfy the relation: $2 \leq x+y+z \leq 500$, and x, y, or z may be 0) and was found to have a weight average molecular weight of 9,800 as measured by GPC analysis in terms of standard polystyrene.

Comparative Example 1

The resin prepared in Synthesis Example 1 was dissolved in propylene glycol monomethyl ether acetate, and then the solution was subjected to ion-exchange treatment, to thereby yield a resin solution (solid content: 30.00% by mass). To 2.74 g of the resin solution were added 0.08 g of propylene glycol monomethyl ether acetate containing 1% by mass surfactant (R-40, available from DIC Corporation), 0.25 g of TMOM-BP (available from Honshu Chemical Industry Co., Ltd.), 0.62 g of propylene glycol monomethyl ether containing 2% by mass pyridinium p-hydroxybenzenesulfonate, 5.65 g of propylene glycol monomethyl ether acetate, and 2.67 g of propylene glycol monomethyl ether, and the resultant mixture was filtered with a polytetrafluoroethylene-made micro filter having a pore size of 0.1 μm, to thereby prepare a solution of a protective film-forming composition.

Comparative Example 2

The resin prepared in Synthesis Example 1 was dissolved in propylene glycol monomethyl ether acetate, and then the solution was subjected to ion-exchange treatment, to thereby yield a resin solution (solid content: 30.00% by mass). To 2.74 g of the resin solution were added 0.08 g of propylene glycol monomethyl ether acetate containing 1% by mass surfactant (R-40, available from DIC Corporation), 0.25 g of TMOM-BP (available from Honshu Chemical Industry Co., Ltd.), 1.23 g of propylene glycol monomethyl ether containing 1% by mass pyridinium p-toluenesulfonate (available from Tokyo Chemical Industry Co., Ltd.), 5.65 g of propylene glycol monomethyl ether acetate, and 2.06 g of propylene glycol monomethyl ether, and the resultant mixture was filtered with a polytetrafluoroethylene-made micro filter having a pore size of 0.1 μm, to thereby prepare a solution of a protective film-forming composition.

Comparative Example 3

The resin prepared in Synthesis Example 1 was dissolved in propylene glycol monomethyl ether acetate, and then the solution was subjected to ion-exchange treatment, to thereby yield a resin solution (solid content: 30.00% by mass). To 2.74 g of the resin solution were added 0.08 g of propylene glycol monomethyl ether acetate containing 1% by mass surfactant (R-40, available from DIC Corporation), 0.25 g of PL-LI (available from Midori Kagaku Co., Ltd.), 0.62 g of propylene glycol monomethyl ether containing 2% by mass pyridinium p-hydroxybenzenesulfonate, 5.65 g of propylene glycol monomethyl ether acetate, and 2.67 g of propylene glycol monomethyl ether, and the resultant mixture was filtered with a polytetrafluoroethylene-made micro filter having a pore size of 0.1 μm, to thereby prepare a solution of a protective film-forming composition.

Comparative Example 4

The resin prepared in Synthesis Example 1 was dissolved in propylene glycol monomethyl ether acetate, and then the solution was subjected to ion-exchange treatment, to thereby yield a resin solution (solid content: 30.00% by mass). To 2.74 g of the resin solution were added 0.08 g of propylene glycol monomethyl ether acetate containing 1% by mass surfactant (R-40, available from DIC Corporation), 0.25 g of PL-LI (available from Midori Kagaku Co., Ltd.), 1.25 g of propylene glycol monomethyl ether containing 1% by mass pyridinium p-toluenesulfonate (available from Tokyo Chemical Industry Co., Ltd.), 5.65 g of propylene glycol monomethyl ether acetate, and 2.06 g of propylene glycol monomethyl ether, and the resultant mixture was filtered with a polytetrafluoroethylene-made micro filter having a pore size of 0.1 μm, to thereby prepare a solution of a protective film-forming composition.

Comparative Example 5

The resin prepared in Synthesis Example 1 was dissolved in propylene glycol monomethyl ether acetate, and then the solution was subjected to ion-exchange treatment, to thereby yield a resin solution (solid content: 30.00% by mass). To 2.74 g of the resin solution were added 0.08 g of propylene glycol monomethyl ether acetate containing 1% by mass surfactant (R-40, available from DIC Corporation), 0.25 g of PL-LI (available from Midori Kagaku Co., Ltd.), 0.62 g of propylene glycol monomethyl ether containing 2% by mass K-PURE [registered trademark] TAG2689 (available from King Industries Inc.), 5.65 g of propylene glycol monomethyl ether acetate, and 2.67 g of propylene glycol monomethyl ether, and the resultant mixture was filtered with a polytetrafluoroethylene-made micro filter having a pore size of 0.1 μm, to thereby prepare a solution of a protective film-forming composition.

Comparative Example 6

The resin prepared in Synthesis Example 2 was dissolved in propylene glycol monomethyl ether acetate, and then the solution was subjected to ion-exchange treatment, to thereby yield a resin solution (solid content: 18.91% by mass). To 2.25 g of the resin solution were added 0.09 g of propylene glycol monomethyl ether acetate containing 1% by mass surfactant (R-40, available from DIC Corporation), 0.13 g of TMOM-BP (available from Honshu Chemical Industry Co., Ltd.), 0.64 g of propylene glycol monomethyl ether containing 1% by mass pyridinium p-toluenesulfonate (available from Tokyo Chemical Industry Co., Ltd.), 0.02 g of propylene glycol monomethyl ether acetate, and 3.88 g of propylene glycol monomethyl ether, and the resultant mixture was filtered with a polytetrafluoroethylene-made micro filter having a pore size of 0.1 μm, to thereby prepare a solution of a protective film-forming composition.

Comparative Example 7

The resin prepared in Synthesis Example 3 was dissolved in propylene glycol monomethyl ether acetate, and then the solution was subjected to ion-exchange treatment, to thereby yield a resin solution (solid content: 30.30% by mass). To 2.25 g of the resin solution were added 0.14 g of propylene glycol monomethyl ether acetate containing 1% by mass surfactant (R-40, available from DIC Corporation), 0.14 g of TMOM-BP (available from Honshu Chemical Industry Co., Ltd.), 1.02 g of propylene glycol monomethyl ether containing 2% by mass pyridinium p-hydroxybenzenesulfonate, 4.99 g of propylene glycol monomethyl ether acetate, 1.23 g of propylene glycol monomethyl ether, and 2.23 g of ethyl lactate, and the resultant mixture was filtered with a polytetrafluoroethylene-made micro filter having a pore size of 0.1 μm, to thereby prepare a solution of a protective film-forming composition.

Comparative Example 8

To 3.50 g of the propylene glycol monomethyl ether resin solution prepared in Synthesis Example 4 (solid content: 13.67% by mass) were added 0.05 g of propylene glycol monomethyl ether acetate containing 1% by mass surfactant (R-40, available from DIC Corporation), 0.14 g of TMOM-BP (available from Honshu Chemical Industry Co., Ltd.), 0.72 g of propylene glycol monomethyl ether containing 1% by mass K-PURE [registered trademark] TAG2689 (available from King Industries Inc.), 1.86 g of propylene glycol monomethyl ether acetate, and 0.72 g of propylene glycol monomethyl ether, and the resultant mixture was filtered with a polytetrafluoroethylene-made micro filter having a pore size of 0.1 μm, to thereby prepare a solution of a protective film-forming composition.

Comparative Example 9

To 1.19 g of a propylene glycol monomethyl ether resin solution containing 1,1'-methylenebis(naphthalen-2-ol) (solid content: 30.40% by mass) were added 0.07 g of propylene glycol monomethyl ether acetate containing 1% by mass surfactant (R-40, available from DIC Corporation), 0.11 g of TMOM-BP (available from Honshu Chemical Industry Co., Ltd.), 0.54 g of propylene glycol monomethyl ether containing 2% by mass pyridinium p-hydroxybenzenesulfonate, 1.58 g of propylene glycol monomethyl ether acetate, and 2.51 g of propylene glycol monomethyl ether, and the resultant mixture was filtered with a polytetrafluoroethylene-made micro filter having a pore size of 0.1 μm, to thereby prepare a solution of a protective film-forming composition.

Comparative Example 10

To 1.98 g of a propylene glycol monomethyl ether resin solution containing 1,1'-methylenebis(naphthalen-2-ol) (solid content: 30.40% by mass) were added 0.12 g of propylene glycol monomethyl ether acetate containing 1% by mass surfactant (R-40, available from DIC Corporation), 0.18 g of PL-LI (available from Midori Kagaku Co., Ltd.), 0.90 g of propylene glycol monomethyl ether containing 2% by mass pyridinium p-hydroxybenzenesulfonate, 2.64 g of propylene glycol monomethyl ether acetate, and 4.18 g of propylene glycol monomethyl ether, and the resultant mixture was filtered with a polytetrafluoroethylene-made micro filter having a pore size of 0.1 μm, to thereby prepare a solution of a protective film-forming composition.

Comparative Example 11

To 3.84 g of the resin solution prepared in Synthesis Example 5 (solid content: 20% by mass) were added 0.077 g of PL-LI (available from Midori Kagaku Co., Ltd.), 0.0077 g of p-hydroxybenzenesulfonic acid (available from Tokyo Chemical Industry Co., Ltd.), 1.92 g of propylene glycol monomethyl ether acetate, and 14.16 g of propylene glycol monomethyl ether, to thereby prepare a solution of a protective film-forming composition.

Comparative Example 12

To 3.84 g of the resin solution prepared in Synthesis Example 5 (solid content: 20% by mass) were added 0.077 g of TMOM-BP (available from Honshu Chemical Industry Co., Ltd.), 0.0077 g of p-hydroxybenzenesulfonic acid (available from Tokyo Chemical Industry Co., Ltd.), 1.92 g of propylene glycol monomethyl ether acetate, and 14.16 g of propylene glycol monomethyl ether, to thereby prepare a solution of a protective film-forming composition.

Comparative Example 13

To 3.35 g of the resin solution prepared in Synthesis Example 6 (solid content: 20% by mass) were added 0.067 g of PL-LI (available from Midori Kagaku Co., Ltd.), 0.0067 g of p-hydroxybenzenesulfonic acid (available from Tokyo Chemical Industry Co., Ltd.), 1.92 g of propylene glycol monomethyl ether acetate, and 14.65 g of propylene glycol monomethyl ether, to thereby prepare a solution of a protective film-forming composition.

Comparative Example 14

To 3.35 g of the resin solution prepared in Synthesis Example 6 (solid content: 20% by mass) were added 0.067 g of TMOM-BP (available from Honshu Chemical Industry Co., Ltd.), 0.0067 g of p-hydroxybenzenesulfonic acid (available from Tokyo Chemical Industry Co., Ltd.), 1.92 g of propylene glycol monomethyl ether acetate, and 14.65 g of propylene glycol monomethyl ether, to thereby prepare a solution of a protective film-forming composition.

Comparative Example 15

To 2.02 g of the resin solution prepared in Synthesis Example 5 (solid content: 20% by mass) were added 0.040 g of TMOM-BP (available from Honshu Chemical Industry Co., Ltd.), 0.0040 g of pyridinium trifluoromethanesulfonate (available from Tokyo Chemical Industry Co., Ltd.), 0.40 g of gallic acid (available from Tokyo Chemical Industry Co., Ltd.), 1.92 g of propylene glycol monomethyl ether acetate, and 15.65 g of propylene glycol monomethyl ether, to thereby prepare a solution of a protective film-forming composition.

Comparative Example 16

The resin prepared in Synthesis Example 1 was dissolved in propylene glycol monomethyl ether acetate, and then the solution was subjected to ion-exchange treatment, to thereby yield a resin solution (solid content: 30.00% by mass). To 2.20 g of the resin solution were added 0.07 g of propylene glycol monomethyl ether acetate containing 1% by mass surfactant (R-40, available from DIC Corporation), 0.13 g of TMOM-BP (available from Honshu Chemical Industry Co., Ltd.), 0.33 g of propylene glycol monomethyl ether containing 2% by mass pyridinium p-toluenesulfonate (available from Tokyo Chemical Industry Co., Ltd.), 1.15 g of propylene glycol monomethyl ether acetate, and 6.12 g of

Example 1

The resin prepared in Synthesis Example 1 was dissolved in propylene glycol monomethyl ether acetate, and then the solution was subjected to ion-exchange treatment, to thereby yield a resin solution (solid content: 30.00% by mass). To 1.22 g of the resin solution were added 0.04 g of propylene glycol monomethyl ether acetate containing 1% by mass surfactant (R-40, available from DIC Corporation), 0.11 g of TMOM-BP (available from Honshu Chemical Industry Co., Ltd.), 0.27 g of propylene glycol monomethyl ether containing 2% by mass pyridinium p-hydroxybenzenesulfonate, 0.10 g of propylene glycol monomethyl ether containing 8.85% by mass gallic acid (available from Tokyo Chemical Industry Co., Ltd.), 0.77 g of propylene glycol monomethyl ether acetate, and 3.50 g of propylene glycol monomethyl ether, and the resultant mixture was filtered with a polytetrafluoroethylene-made micro filter having a pore size of 0.1 µm, to thereby prepare a solution of a protective film-forming composition.

Example 2

The resin prepared in Synthesis Example 1 was dissolved in propylene glycol monomethyl ether acetate, and then the solution was subjected to ion-exchange treatment, to thereby yield a resin solution (solid content: 30.00% by mass). To 1.22 g of the resin solution were added 0.04 g of propylene glycol monomethyl ether acetate containing 1% by mass surfactant (R-40, available from DIC Corporation), 0.11 g of TMOM-BP (available from Honshu Chemical Industry Co., Ltd.), 0.55 g of propylene glycol monomethyl ether containing 1% by mass pyridinium p-toluenesulfonate (available from Tokyo Chemical Industry Co., Ltd.), 0.10 g of propylene glycol monomethyl ether containing 8.85% by mass gallic acid (available from Tokyo Chemical Industry Co., Ltd.), 0.77 g of propylene glycol monomethyl ether acetate, and 3.23 g of propylene glycol monomethyl ether, and the resultant mixture was filtered with a polytetrafluoroethylene-made micro filter having a pore size of 0.1 µm, to thereby prepare a solution of a protective film-forming composition.

Example 3

The resin prepared in Synthesis Example 1 was dissolved in propylene glycol monomethyl ether acetate, and then the solution was subjected to ion-exchange treatment, to thereby yield a resin solution (solid content: 30.00% by mass). To 1.77 g of the resin solution were added 0.05 g of propylene glycol monomethyl ether acetate containing 1% by mass surfactant (R-40, available from DIC Corporation), 0.16 g of TMOM-BP (available from Honshu Chemical Industry Co., Ltd.), 0.40 g of propylene glycol monomethyl ether containing 2% by mass pyridinium p-hydroxybenzenesulfonate, 0.30 g of propylene glycol monomethyl ether containing 4.50% by mass 2,3,3',4,4',5'-hexahydroxybenzophenone (available from Tokyo Chemical Industry Co., Ltd.), 1.50 g of propylene glycol monomethyl ether acetate, and 5.48 g of propylene glycol monomethyl ether, and the resultant mixture was filtered with a polytetrafluoroethylene-made micro filter having a pore size of 0.1 µm, to thereby prepare a solution of a protective film-forming composition.

Example 4

The resin prepared in Synthesis Example 1 was dissolved in propylene glycol monomethyl ether acetate, and then the solution was subjected to ion-exchange treatment, to thereby yield a resin solution (solid content: 30.00% by mass). To 1.77 g of the resin solution were added 0.05 g of propylene glycol monomethyl ether acetate containing 1% by mass surfactant (R-40, available from DIC Corporation), 0.16 g of TMOM-BP (available from Honshu Chemical Industry Co., Ltd.), 0.80 g of propylene glycol monomethyl ether containing 1% by mass pyridinium p-toluenesulfonate (available from Tokyo Chemical Industry Co., Ltd.), 0.30 g of propylene glycol monomethyl ether containing 4.50% by mass 2,3,3',4,4',5'-hexahydroxybenzophenone (available from Tokyo Chemical Industry Co., Ltd.), 1.50 g of propylene glycol monomethyl ether acetate, and 5.44 g of propylene glycol monomethyl ether, and the resultant mixture was filtered with a polytetrafluoroethylene-made micro filter having a pore size of 0.1 µm, to thereby prepare a solution of a protective film-forming composition.

Example 5

The resin prepared in Synthesis Example 1 was dissolved in propylene glycol monomethyl ether acetate, and then the solution was subjected to ion-exchange treatment, to thereby yield a resin solution (solid content: 30.00% by mass). To 1.42 g of the resin solution were added 0.04 g of propylene glycol monomethyl ether acetate containing 1% by mass surfactant (R-40, available from DIC Corporation), 0.13 g of PL-LI (available from Midori Kagaku Co., Ltd.), 0.32 g of propylene glycol monomethyl ether containing 2% by mass pyridinium p-hydroxybenzenesulfonate, 0.12 g of propylene glycol monomethyl ether containing 8.85% by mass gallic acid (available from Tokyo Chemical Industry Co., Ltd.), 0.90 g of propylene glycol monomethyl ether acetate, and 4.09 g of propylene glycol monomethyl ether, and the resultant mixture was filtered with a polytetrafluoroethylene-made micro filter having a pore size of 0.1 µm, to thereby prepare a solution of a protective film-forming composition.

Example 6

The resin prepared in Synthesis Example 1 was dissolved in propylene glycol monomethyl ether acetate, and then the solution was subjected to ion-exchange treatment, to thereby yield a resin solution (solid content: 30.00% by mass). To 1.42 g of the resin solution were added 0.04 g of propylene glycol monomethyl ether acetate containing 1% by mass surfactant (R-40, available from DIC Corporation), 0.13 g of PL-LI (available from Midori Kagaku Co., Ltd.), 0.32 g of propylene glycol monomethyl ether containing 2% by mass pyridinium p-toluenesulfonate (available from Tokyo Chemical Industry Co., Ltd.), 0.12 g of propylene glycol monomethyl ether containing 8.85% by mass gallic acid (available from Tokyo Chemical Industry Co., Ltd.), 0.90 g of propylene glycol monomethyl ether acetate, and 4.09 g of propylene glycol monomethyl ether, and the resultant mixture was filtered with a polytetrafluoroethylene-made micro filter having a pore size of 0.1 µm, to thereby prepare a solution of a protective film-forming composition.

Example 7

The resin prepared in Synthesis Example 1 was dissolved in propylene glycol monomethyl ether acetate, and then the solution was subjected to ion-exchange treatment, to thereby yield a resin solution (solid content: 30.00% by mass). To 1.42 g of the resin solution were added 0.04 g of propylene glycol monomethyl ether acetate containing 1% by mass surfactant (R-40, available from DIC Corporation), 0.13 g of PL-LI (available from Midori Kagaku Co., Ltd.), 0.32 g of propylene glycol monomethyl ether containing 2% K-PURE [registered trademark] TAG2689 (available from King Industries Inc.), 0.12 g of propylene glycol monomethyl ether containing 8.85% by mass gallic acid (available from Tokyo Chemical Industry Co., Ltd.), 0.90 g of propylene glycol monomethyl ether acetate, and 4.09 g of propylene glycol monomethyl ether, and the resultant mixture was filtered with a polytetrafluoroethylene-made micro filter having a pore size of 0.1 μm, to thereby prepare a solution of a protective film-forming composition.

Example 8

The resin prepared in Synthesis Example 1 was dissolved in propylene glycol monomethyl ether acetate, and then the solution was subjected to ion-exchange treatment, to thereby yield a resin solution (solid content: 30.00% by mass). To 1.77 g of the resin solution were added 0.05 g of propylene glycol monomethyl ether acetate containing 1% by mass surfactant (R-40, available from DIC Corporation), 0.16 g of PL-LI (available from Midori Kagaku Co., Ltd.), 0.40 g of propylene glycol monomethyl ether containing 2% by mass pyridinium p-hydroxybenzenesulfonate, 0.30 g of propylene glycol monomethyl ether containing 4.50% by mass 2,3,3',4,4',5'-hexahydroxybenzophenone (available from Tokyo Chemical Industry Co., Ltd.), 1.50 g of propylene glycol monomethyl ether acetate, and 5.84 g of propylene glycol monomethyl ether, and the resultant mixture was filtered with a polytetrafluoroethylene-made micro filter having a pore size of 0.1 μm, to thereby prepare a solution of a protective film-forming composition.

Example 9

The resin prepared in Synthesis Example 1 was dissolved in propylene glycol monomethyl ether acetate, and then the solution was subjected to ion-exchange treatment, to thereby yield a resin solution (solid content: 30.00% by mass). To 1.77 g of the resin solution were added 0.05 g of propylene glycol monomethyl ether acetate containing 1% by mass surfactant (R-40, available from DIC Corporation), 0.16 g of PL-LI (available from Midori Kagaku Co., Ltd.), 0.80 g of propylene glycol monomethyl ether containing 1% by mass pyridinium p-toluenesulfonate (available from Tokyo Chemical Industry Co., Ltd.), 0.30 g of propylene glycol monomethyl ether containing 4.50% by mass 2,3,3',4,4',5'-hexahydroxybenzophenone (available from Tokyo Chemical Industry Co., Ltd.), 1.50 g of propylene glycol monomethyl ether acetate, and 5.44 g of propylene glycol monomethyl ether, and the resultant mixture was filtered with a polytetrafluoroethylene-made micro filter having a pore size of 0.1 μm, to thereby prepare a solution of a protective film-forming composition.

Example 10

The resin prepared in Synthesis Example 1 was dissolved in propylene glycol monomethyl ether acetate, and then the solution was subjected to ion-exchange treatment, to thereby yield a resin solution (solid content: 30.00% by mass). To 1.77 g of the resin solution were added 0.05 g of propylene glycol monomethyl ether acetate containing 1% by mass surfactant (R-40, available from DIC Corporation), 0.16 g of PL-LI (available from Midori Kagaku Co., Ltd.), 0.40 g of propylene glycol monomethyl ether containing 2% by mass K-PURE [registered trademark] TAG2689 (available from King Industries Inc.), 0.30 g of propylene glycol monomethyl ether containing 4.50% by mass 2,3,3',4,4',5'-hexahydroxybenzophenone (available from Tokyo Chemical Industry Co., Ltd.), 1.50 g of propylene glycol monomethyl ether acetate, and 5.84 g of propylene glycol monomethyl ether, and the resultant mixture was filtered with a polytetrafluoroethylene-made micro filter having a pore size of 0.1 μm, to thereby prepare a solution of a protective film-forming composition.

Example 11

The resin prepared in Synthesis Example 2 was dissolved in propylene glycol monomethyl ether acetate, and then the solution was subjected to ion-exchange treatment, to thereby yield a resin solution (solid content: 18.91% by mass). To 2.25 g of the resin solution were added 0.09 g of propylene glycol monomethyl ether acetate containing 1% by mass surfactant (R-40, available from DIC Corporation), 0.13 g of TMOM-BP (available from Honshu Chemical Industry Co., Ltd.), 0.64 g of propylene glycol monomethyl ether containing 1% by mass pyridinium p-toluenesulfonate (available from Tokyo Chemical Industry Co., Ltd.), 0.12 g of propylene glycol monomethyl ether containing 8.85% by mass gallic acid (available from Tokyo Chemical Industry Co., Ltd.), 0.02 g of propylene glycol monomethyl ether acetate, and 3.77 g of propylene glycol monomethyl ether, and the resultant mixture was filtered with a polytetrafluoroethylene-made micro filter having a pore size of 0.1 μm, to thereby prepare a solution of a protective film-forming composition.

Example 12

The resin prepared in Synthesis Example 3 was dissolved in propylene glycol monomethyl ether acetate, and then the solution was subjected to ion-exchange treatment, to thereby yield a resin solution (solid content: 30.30% by mass). To 2.89 g of the resin solution were added 0.18 g of propylene glycol monomethyl ether acetate containing 1% by mass surfactant (R-40, available from DIC Corporation), 0.18 g of TMOM-BP (available from Honshu Chemical Industry Co., Ltd.), 1.31 g of propylene glycol monomethyl ether containing 2% by mass pyridinium p-hydroxybenzenesulfonate, 0.25 g of propylene glycol monomethyl ether containing 8.85% by mass gallic acid (available from Tokyo Chemical Industry Co., Ltd.), 4.36 g of propylene glycol monomethyl ether acetate, 0.67 g of propylene glycol monomethyl ether, and 2.18 g of ethyl lactate, and the resultant mixture was filtered with a polytetrafluoroethylene-made micro filter having a pore size of 0.1 μm, to thereby prepare a solution of a protective film-forming composition.

Example 13

The resin prepared in Synthesis Example 3 was dissolved in propylene glycol monomethyl ether acetate, and then the solution was subjected to ion-exchange treatment, to thereby yield a resin solution (solid content: 30.30% by mass). To 1.69 g of the resin solution were added 0.10 g of propylene glycol monomethyl ether acetate containing 1% by mass surfactant (R-40, available from DIC Corporation), 0.10 g of TMOM-BP (available from Honshu Chemical Industry Co., Ltd.), 0.77 g of propylene glycol monomethyl ether containing 2% by mass pyridinium p-toluenesulfonate (available from Tokyo Chemical Industry Co., Ltd.), 0.14 g of propylene glycol monomethyl ether containing 8.85% by mass gallic acid (available from Tokyo Chemical Industry Co., Ltd.), 2.54 g of propylene glycol monomethyl ether acetate, 0.39 g of propylene glycol monomethyl ether, and 1.27 g of ethyl lactate, and the resultant mixture was filtered with a polytetrafluoroethylene-made micro filter having a pore size of 0.1 μm, to thereby prepare a solution of a protective film-forming composition.

Example 14

The resin prepared in Synthesis Example 3 was dissolved in propylene glycol monomethyl ether acetate, and then the solution was subjected to ion-exchange treatment, to thereby yield a resin solution (solid content: 30.30% by mass). To 1.69 g of the resin solution were added 0.10 g of propylene glycol monomethyl ether acetate containing 1% by mass surfactant (R-40, available from DIC Corporation), 0.10 g of TMOM-BP (available from Honshu Chemical Industry Co., Ltd.), 0.77 g of propylene glycol monomethyl ether containing 2% by mass K-PURE [registered trademark] TAG2689 (available from King Industries Inc.), 0.14 g of propylene glycol monomethyl ether containing 8.85% by mass gallic acid (available from Tokyo Chemical Industry Co., Ltd.), 2.54 g of propylene glycol monomethyl ether acetate, 0.39 g of propylene glycol monomethyl ether, and 1.27 g of ethyl lactate, and the resultant mixture was filtered with a polytetrafluoroethylene-made micro filter having a pore size of 0.1 μm, to thereby prepare a solution of a protective film-forming composition.

Example 15

To 3.50 g of the propylene glycol monomethyl ether resin solution prepared in Synthesis Example 4 (solid content: 13.67% by mass) were added 0.05 g of propylene glycol monomethyl ether acetate containing 1% by mass surfactant (R-40, available from DIC Corporation), 0.14 g of TMOM-BP (available from Honshu Chemical Industry Co., Ltd.), 0.36 g of propylene glycol monomethyl ether containing 2% by mass K-PURE [registered trademark] TAG2689 (available from King Industries Inc.), 0.14 g of propylene glycol monomethyl ether containing 8.85% by mass gallic acid (available from Tokyo Chemical Industry Co., Ltd.), 1.86 g of propylene glycol monomethyl ether acetate, and 0.96 g of propylene glycol monomethyl ether, and the resultant mixture was filtered with a polytetrafluoroethylene-made micro filter having a pore size of 0.1 μm, to thereby prepare a solution of a protective film-forming composition.

Example 16

To 3.50 g of the propylene glycol monomethyl ether resin solution prepared in Synthesis Example 4 (solid content: 13.67% by mass) were added 0.05 g of propylene glycol monomethyl ether acetate containing 1% by mass surfactant (R-40, available from DIC Corporation), 0.14 g of TMOM-BP (available from Honshu Chemical Industry Co., Ltd.), 0.36 g of propylene glycol monomethyl ether containing 2% by mass K-PURE [registered trademark] TAG2689 (available from King Industries Inc.), 0.27 g of propylene glycol monomethyl ether containing 8.85% by mass gallic acid (available from Tokyo Chemical Industry Co., Ltd.), 1.86 g of propylene glycol monomethyl ether acetate, and 0.84 g of propylene glycol monomethyl ether, and the resultant mixture was filtered with a polytetrafluoroethylene-made micro filter having a pore size of 0.1 μm, to thereby prepare a solution of a protective film-forming composition.

Example 17

To 5.00 g of the propylene glycol monomethyl ether resin solution prepared in Synthesis Example 4 (solid content: 13.67% by mass) were added 0.07 g of propylene glycol monomethyl ether acetate containing 1% by mass surfactant (R-40, available from DIC Corporation), 0.21 g of TMOM-BP (available from Honshu Chemical Industry Co., Ltd.), 0.51 g of propylene glycol monomethyl ether containing 2% by mass K-PURE [registered trademark] TAG2689 (available from King Industries Inc.), 1.93 g of propylene glycol monomethyl ether containing 8.85% by mass gallic acid (available from Tokyo Chemical Industry Co., Ltd.), 2.66 g of propylene glycol monomethyl ether acetate, and 0.21 g of propylene glycol monomethyl ether, and the resultant mixture was filtered with a polytetrafluoroethylene-made micro filter having a pore size of 0.1 μm, to thereby prepare a solution of a protective film-forming composition.

Example 18

To 1.19 g of a propylene glycol monomethyl ether resin solution containing 1,1'-methylenebis(naphthalen-2-ol) (solid content: 30.40% by mass) were added 0.07 g of propylene glycol monomethyl ether acetate containing 1% by mass surfactant (R-40, available from DIC Corporation), 0.11 g of TMOM-BP (available from Honshu Chemical Industry Co., Ltd.), 0.54 g of propylene glycol monomethyl ether containing 2% by mass pyridinium p-hydroxybenzenesulfonate, 0.20 g of propylene glycol monomethyl ether containing 8.85% by mass gallic acid (available from Tokyo Chemical Industry Co., Ltd.), 1.55 g of propylene glycol monomethyl ether acetate, and 2.32 g of propylene glycol monomethyl ether, and the resultant mixture was filtered with a polytetrafluoroethylene-made micro filter having a pore size of 0.1 μm, to thereby prepare a solution of a protective film-forming composition.

Example 19

To 1.98 g of a propylene glycol monomethyl ether resin solution containing 1,1'-methylenebis(naphthalen-2-ol) (solid content: 30.40% by mass) were added 0.12 g of propylene glycol monomethyl ether acetate containing 1% by mass surfactant (R-40, available from DIC Corporation), 0.18 g of PL-LI (available from Midori Kagaku Co., Ltd.), 0.90 g of propylene glycol monomethyl ether containing 2% by mass pyridinium p-hydroxybenzenesulfonate, 0.34 g of propylene glycol monomethyl ether containing 8.85% by mass gallic acid (available from Tokyo Chemical Industry Co., Ltd.), 2.64 g of propylene glycol monomethyl ether acetate, and 3.87 g of propylene glycol monomethyl ether, and the resultant mixture was filtered with a polytetrafluoroethylene-made micro filter having a pore size of 0.1 μm, to thereby prepare a solution of a protective film-forming composition.

Example 20

To 1.98 g of a propylene glycol monomethyl ether resin solution containing 1,1'-methylenebis(naphthalen-2-ol)

(solid content: 30.40% by mass) were added 0.12 g of propylene glycol monomethyl ether acetate containing 1% by mass surfactant (R-40, available from DIC Corporation), 0.18 g of PL-LI (available from Midori Kagaku Co., Ltd.), 0.90 g of propylene glycol monomethyl ether containing 2% by mass pyridinium p-hydroxybenzenesulfonate, 0.67 g of propylene glycol monomethyl ether containing 4.50% by mass 2,3,3',4,4',5'-hexahydroxybenzophenone (available from Tokyo Chemical Industry Co., Ltd.), 2.64 g of propylene glycol monomethyl ether acetate, and 3.54 g of propylene glycol monomethyl ether, and the resultant mixture was filtered with a polytetrafluoroethylene-made micro filter having a pore size of 0.1 µm, to thereby prepare a solution of a protective film-forming composition.

Example 21

To 3.68 g of the resin solution prepared in Synthesis Example 5 (solid content: 20% by mass) were added 0.066 g of PL-LI (available from Midori Kagaku Co., Ltd.), 0.0066 g of p-hydroxybenzenesulfonic acid (available from Tokyo Chemical Industry Co., Ltd.), 0.033 g of gallic acid (available from Tokyo Chemical Industry Co., Ltd.), 1.92 g of propylene glycol monomethyl ether acetate, and 14.16 g of propylene glycol monomethyl ether, to thereby prepare a solution of a protective film-forming composition.

Example 22

To 3.68 g of the resin solution prepared in Synthesis Example 5 (solid content: 20% by mass) were added 0.073 g of PL-LI (available from Midori Kagaku Co., Ltd.), 0.0073 g of pyridinium trifluoromethanesulfonate (available from Tokyo Chemical Industry Co., Ltd.), 0.037 g of gallic acid (available from Tokyo Chemical Industry Co., Ltd.), 1.92 g of propylene glycol monomethyl ether acetate, and 14.16 g of propylene glycol monomethyl ether, to thereby prepare a solution of a protective film-forming composition.

Example 23

To 3.68 g of the resin solution prepared in Synthesis Example 5 (solid content: 20% by mass) were added 0.073 g of TMOM-BP (available from Honshu Chemical Industry Co., Ltd.), 0.0073 g of p-hydroxybenzenesulfonic acid (available from Tokyo Chemical Industry Co., Ltd.), 0.037 g of gallic acid (available from Tokyo Chemical Industry Co., Ltd.), 1.92 g of propylene glycol monomethyl ether acetate, and 14.16 g of propylene glycol monomethyl ether, to thereby prepare a solution of a protective film-forming composition.

Example 24

To 3.68 g of the resin solution prepared in Synthesis Example 5 (solid content: 20% by mass) were added 0.073 g of TMOM-BP (available from Honshu Chemical Industry Co., Ltd.), 0.0073 g of pyridinium trifluoromethanesulfonate (available from Tokyo Chemical Industry Co., Ltd.), 0.037 g of gallic acid (available from Tokyo Chemical Industry Co., Ltd.), 1.92 g of propylene glycol monomethyl ether acetate, and 14.16 g of propylene glycol monomethyl ether, to thereby prepare a solution of a protective film-forming composition.

Example 25

To 3.68 g of the resin solution prepared in Synthesis Example 6 (solid content: 20% by mass) were added 0.073 g of PL-LI (available from Midori Kagaku Co., Ltd.), 0.0073 g of p-hydroxybenzenesulfonic acid (available from Tokyo Chemical Industry Co., Ltd.), 0.037 g of gallic acid (available from Tokyo Chemical Industry Co., Ltd.), 1.92 g of propylene glycol monomethyl ether acetate, and 14.16 g of propylene glycol monomethyl ether, to thereby prepare a solution of a protective film-forming composition.

Example 26

To 3.68 g of the resin solution prepared in Synthesis Example 6 (solid content: 20% by mass) were added 0.073 g of PL-LI (available from Midori Kagaku Co., Ltd.), 0.0073 g of pyridinium trifluoromethanesulfonate (available from Tokyo Chemical Industry Co., Ltd.), 0.037 g of gallic acid (available from Tokyo Chemical Industry Co., Ltd.), 1.92 g of propylene glycol monomethyl ether acetate, and 14.16 g of propylene glycol monomethyl ether, to thereby prepare a solution of a protective film-forming composition.

Example 27

To 3.68 g of the resin solution prepared in Synthesis Example 6 (solid content: 20% by mass) were added 0.073 g of TMOM-BP (available from Honshu Chemical Industry Co., Ltd.), 0.0073 g of p-hydroxybenzenesulfonic acid (available from Tokyo Chemical Industry Co., Ltd.), 0.037 g of gallic acid (available from Tokyo Chemical Industry Co., Ltd.), 1.92 g of propylene glycol monomethyl ether acetate, and 14.16 g of propylene glycol monomethyl ether, to thereby prepare a solution of a protective film-forming composition.

Example 28

To 3.68 g of the resin solution prepared in Synthesis Example 6 (solid content: 20% by mass) were added 0.073 g of TMOM-BP (available from Honshu Chemical Industry Co., Ltd.), 0.0073 g of pyridinium trifluoromethanesulfonate (available from Tokyo Chemical Industry Co., Ltd.), 0.037 g of gallic acid (available from Tokyo Chemical Industry Co., Ltd.), 1.92 g of propylene glycol monomethyl ether acetate, and 14.16 g of propylene glycol monomethyl ether, to thereby prepare a solution of a protective film-forming composition.

Example 29

To 3.52 g of the resin solution prepared in Synthesis Example 5 (solid content: 20% by mass) were added 0.070 g of TMOM-BP (available from Honshu Chemical Industry Co., Ltd.), 0.007 g of pyridinium trifluoromethanesulfonate (available from Tokyo Chemical Industry Co., Ltd.), 0.070 g of gallic acid (available from Tokyo Chemical Industry Co., Ltd.), 1.92 g of propylene glycol monomethyl ether acetate, and 14.42 g of propylene glycol monomethyl ether, to thereby prepare a solution of a protective film-forming composition.

Example 30

To 3.26 g of the resin solution prepared in Synthesis Example 5 (solid content: 20% by mass) were added 0.065 g of TMOM-BP (available from Honshu Chemical Industry Co., Ltd.), 0.0065 g of pyridinium trifluoromethanesulfonate (available from Tokyo Chemical Industry Co., Ltd.), 0.130 g of gallic acid (available from Tokyo Chemical Industry Co., Ltd.), 1.92 g of propylene glycol monomethyl ether acetate, and 14.64 g of propylene glycol monomethyl ether, to thereby prepare a solution of a protective film-forming composition.

Example 31

To 3.02 g of the resin solution prepared in Synthesis Example 5 (solid content: 20% by mass) were added 0.060 g of TMOM-BP (available from Honshu Chemical Industry Co., Ltd.), 0.006 g of pyridinium trifluoromethanesulfonate (available from Tokyo Chemical Industry Co., Ltd.), 0.180 g of gallic acid (available from Tokyo Chemical Industry Co., Ltd.), 1.92 g of propylene glycol monomethyl ether acetate, and 14.83 g of propylene glycol monomethyl ether, to thereby prepare a solution of a protective film-forming composition.

Example 32

To 2.82 g of the resin solution prepared in Synthesis Example 5 (solid content: 20% by mass) were added 0.056 g of TMOM-BP (available from Honshu Chemical Industry Co., Ltd.), 0.0056 g of pyridinium trifluoromethanesulfonate (available from Tokyo Chemical Industry Co., Ltd.), 0.224 g of gallic acid (available from Tokyo Chemical Industry Co., Ltd.), 1.92 g of propylene glycol monomethyl ether acetate, and 14.99 g of propylene glycol monomethyl ether, to thereby prepare a solution of a protective film-forming composition.

Example 33

To 2.65 g of the resin solution prepared in Synthesis Example 5 (solid content: 20% by mass) were added 0.053 g of TMOM-BP (available from Honshu Chemical Industry Co., Ltd.), 0.0053 g of pyridinium trifluoromethanesulfonate (available from Tokyo Chemical Industry Co., Ltd.), 0.265 g of gallic acid (available from Tokyo Chemical Industry Co., Ltd.), 1.92 g of propylene glycol monomethyl ether acetate, and 15.14 g of propylene glycol monomethyl ether, to thereby prepare a solution of a protective film-forming composition.

Example 34

To 2.49 g of the resin solution prepared in Synthesis Example 5 (solid content: 20% by mass) were added 0.050 g of TMOM-BP (available from Honshu Chemical Industry Co., Ltd.), 0.005 g of pyridinium trifluoromethanesulfonate (available from Tokyo Chemical Industry Co., Ltd.), 0.30 g of gallic acid (available from Tokyo Chemical Industry Co., Ltd.), 1.92 g of propylene glycol monomethyl ether acetate, and 15.27 g of propylene glycol monomethyl ether, to thereby prepare a solution of a protective film-forming composition.

Example 35

To 2.29 g of the resin solution prepared in Synthesis Example 5 (solid content: 20% by mass) were added 0.046 g of TMOM-BP (available from Honshu Chemical Industry Co., Ltd.), 0.0046 g of pyridinium trifluoromethanesulfonate (available from Tokyo Chemical Industry Co., Ltd.), 0.322 g of gallic acid (available from Tokyo Chemical Industry Co., Ltd.), 1.92 g of propylene glycol monomethyl ether acetate, and 15.43 g of propylene glycol monomethyl ether, to thereby prepare a solution of a protective film-forming composition.

Example 36

To 3.68 g of the resin solution prepared in Synthesis Example 5 (solid content: 20% by mass) were added 0.074 g of TMOM-BIP-A (available from Honshu Chemical Industry Co., Ltd.), 0.0074 g of pyridinium trifluoromethanesulfonate (available from Tokyo Chemical Industry Co., Ltd.), 0.037 g of gallic acid (available from Tokyo Chemical Industry Co., Ltd.), 1.92 g of propylene glycol monomethyl ether acetate, and 14.29 g of propylene glycol monomethyl ether, to thereby prepare a solution of a protective film-forming composition.

Example 37

To 3.68 g of the resin solution prepared in Synthesis Example 5 (solid content: 20% by mass) were added 0.074 g of TMOM-BIP-S (available from Honshu Chemical Industry Co., Ltd.), 0.0074 g of pyridinium trifluoromethanesulfonate (available from Tokyo Chemical Industry Co., Ltd.), 0.037 g of gallic acid (available from Tokyo Chemical Industry Co., Ltd.), 1.92 g of propylene glycol monomethyl ether acetate, and 14.29 g of propylene glycol monomethyl ether, to thereby prepare a solution of a protective film-forming composition.

Example 38

To 3.68 g of the resin solution prepared in Synthesis Example 5 (solid content: 20% by mass) were added 0.074 g of TMOM-BP (available from Honshu Chemical Industry Co., Ltd.), 0.0074 g of pyridinium trifluoromethanesulfonate (available from Tokyo Chemical Industry Co., Ltd.), 0.037 g of 3,4-dihydroxybenzoic acid (available from Tokyo Chemical Industry Co., Ltd.), 1.92 g of propylene glycol monomethyl ether acetate, and 15.65 g of propylene glycol monomethyl ether, to thereby prepare a solution of a protective film-forming composition.

Example 39

To 3.68 g of the resin solution prepared in Synthesis Example 5 (solid content: 20% by mass) were added 0.074 g of TMOM-BP (available from Honshu Chemical Industry Co., Ltd.), 0.0074 g of pyridinium trifluoromethanesulfonate (available from Tokyo Chemical Industry Co., Ltd.), 0.037 g of 2,3,3',4,4',5'-hexahydroxybenzophenone (available from Tokyo Chemical Industry Co., Ltd.), 1.92 g of propylene glycol monomethyl ether acetate, and 15.65 g of propylene glycol monomethyl ether, to thereby prepare a solution of a protective film-forming composition.

Example 40

The resin prepared in Synthesis Example 1 was dissolved in propylene glycol monomethyl ether acetate, and then the solution was subjected to ion-exchange treatment, to thereby yield a resin solution (solid content: 30.00% by mass). To 2.20 g of the resin solution were added 0.07 g of propylene glycol monomethyl ether acetate containing 1% by mass surfactant (R-40, available from DIC Corporation), 0.13 g of TMOM-BP (available from Honshu Chemical Industry Co., Ltd.), 0.33 g of propylene glycol monomethyl ether containing 2% by mass pyridinium p-toluenesulfonate (available from Tokyo Chemical Industry Co., Ltd.), 0.31 g of propylene glycol monomethyl ether containing 5.26% by mass gallic acid (available from Tokyo Chemical Industry Co., Ltd.), 1.15 g of propylene glycol monomethyl ether acetate, and 5.82 g of propylene glycol monomethyl ether, and the resultant mixture was filtered with a polytetrafluoroethylene-made micro filter having a pore size of 0.1 µm, to thereby prepare a solution of a protective film-forming composition.

Example 41

The resin prepared in Synthesis Example 1 was dissolved in propylene glycol monomethyl ether acetate, and then the solution was subjected to ion-exchange treatment, to thereby yield a resin solution (solid content: 30.00% by mass). To 2.20 g of the resin solution were added 0.07 g of propylene glycol monomethyl ether acetate containing 1% by mass surfactant (R-40, available from DIC Corporation), 0.13 g of TMOM-BP (available from Honshu Chemical Industry Co., Ltd.), 0.33 g of propylene glycol monomethyl ether containing 2% by mass pyridinium p-toluenesulfonate (available from Tokyo Chemical Industry Co., Ltd.), 0.18 g of propylene glycol monomethyl ether containing 9.38% by mass 2,3,3',4,4',5'-hexahydroxybenzophenone (available from Tokyo Chemical Industry Co., Ltd.), 1.22 g of propylene glycol monomethyl ether acetate, and 5.96 g of propylene glycol monomethyl ether, and the resultant mixture was filtered with a polytetrafluoroethylene-made micro filter having a pore size of 0.1 µm, to thereby prepare a solution of a protective film-forming composition.

Example 42

The resin prepared in Synthesis Example 1 was dissolved in propylene glycol monomethyl ether acetate, and then the solution was subjected to ion-exchange treatment, to thereby yield a resin solution (solid content: 30.00% by mass). To 3.30 g of the resin solution were added 0.10 g of propylene glycol monomethyl ether acetate containing 1% by mass surfactant (R-40, available from DIC Corporation), 0.20 g of TMOM-BP (available from Honshu Chemical Industry Co., Ltd.), 0.50 g of propylene glycol monomethyl ether containing 2% by mass pyridinium p-toluenesulfonate (available from Tokyo Chemical Industry Co., Ltd.), 0.26 g of propylene glycol monomethyl ether containing 9.53% by mass 2,3,4-trihydroxybenzophenone (available from Tokyo Chemical Industry Co., Ltd.), 1.73 g of propylene glycol monomethyl ether acetate, and 8.94 g of propylene glycol monomethyl ether, and the resultant mixture was filtered with a polytetrafluoroethylene-made micro filter having a pore size of 0.1 µm, to thereby prepare a solution of a protective film-forming composition.

Example 43

The resin prepared in Synthesis Example 1 was dissolved in propylene glycol monomethyl ether acetate, and then the solution was subjected to ion-exchange treatment, to thereby yield a resin solution (solid content: 30.00% by mass). To 2.20 g of the resin solution were added 0.07 g of propylene glycol monomethyl ether acetate containing 1% by mass surfactant (R-40, available from DIC Corporation), 0.13 g of TMOM-BP (available from Honshu Chemical Industry Co., Ltd.), 0.33 g of propylene glycol monomethyl ether containing 2% by mass pyridinium p-toluenesulfonate (available from Tokyo Chemical Industry Co., Ltd.), 0.20 g of propylene glycol monomethyl ether containing 8.33% by mass 2,3',4,4'-tetrahydroxybenzophenone (available from Tokyo Chemical Industry Co., Ltd.), 1.15 g of propylene glycol monomethyl ether acetate, and 5.93 g of propylene glycol monomethyl ether, and the resultant mixture was filtered with a polytetrafluoroethylene-made micro filter having a pore size of 0.1 µm, to thereby prepare a solution of a protective film-forming composition.

Example 44

The resin prepared in Synthesis Example 1 was dissolved in propylene glycol monomethyl ether acetate, and then the solution was subjected to ion-exchange treatment, to thereby yield a resin solution (solid content: 30.00% by mass). To 2.20 g of the resin solution were added 0.07 g of propylene glycol monomethyl ether acetate containing 1% by mass surfactant (R-40, available from DIC Corporation), 0.13 g of TMOM-BP (available from Honshu Chemical Industry Co., Ltd.), 0.33 g of propylene glycol monomethyl ether containing 2% by mass pyridinium p-toluenesulfonate (available from Tokyo Chemical Industry Co., Ltd.), 0.18 g of propylene glycol monomethyl ether containing 9.39% by mass 2,3,4,4'-tetrahydroxybenzophenone (available from Tokyo Chemical Industry Co., Ltd.), 1.15 g of propylene glycol monomethyl ether acetate, and 5.96 g of propylene glycol monomethyl ether, and the resultant mixture was filtered with a polytetrafluoroethylene-made micro filter having a pore size of 0.1 µm, to thereby prepare a solution of a protective film-forming composition.

Example 45

The resin prepared in Synthesis Example 1 was dissolved in propylene glycol monomethyl ether acetate, and then the solution was subjected to ion-exchange treatment, to thereby yield a resin solution (solid content: 30.00% by mass). To 3.30 g of the resin solution were added 0.10 g of propylene glycol monomethyl ether acetate containing 1% by mass surfactant (R-40, available from DIC Corporation), 0.20 g of TMOM-BP (available from Honshu Chemical Industry Co., Ltd.), 0.50 g of propylene glycol monomethyl ether containing 2% by mass pyridinium p-toluenesulfonate (available from Tokyo Chemical Industry Co., Ltd.), 0.26 g of propylene glycol monomethyl ether containing 9.70% by mass 5,5',6,6'-tetrahydroxy-3,3,3',3'-tetramethyl-1,1'-spirobiindane (available from Tokyo Chemical Industry Co., Ltd.), 1.73 g of propylene glycol monomethyl ether acetate, and 8.94 g of propylene glycol monomethyl ether, and the resultant mixture was filtered with a polytetrafluoroethylene-made micro filter having a pore size of 0.1 µm, to thereby prepare a solution of a protective film-forming composition.

Example 46

The resin prepared in Synthesis Example 1 was dissolved in propylene glycol monomethyl ether acetate, and then the solution was subjected to ion-exchange treatment, to thereby yield a resin solution (solid content: 30.00% by mass). To 2.20 g of the resin solution were added 0.07 g of propylene glycol monomethyl ether acetate containing 1% by mass surfactant (R-40, available from DIC Corporation), 0.13 g of TMOM-BP (available from Honshu Chemical Industry Co., Ltd.), 0.33 g of propylene glycol monomethyl ether containing 2% by mass pyridinium p-toluenesulfonate (available from Tokyo Chemical Industry Co., Ltd.), 0.18 g of propylene glycol monomethyl ether containing 9.42% by mass 2,3,4-trihydroxydiphenylmethane (available from Tokyo Chemical Industry Co., Ltd.), 1.15 g of propylene glycol monomethyl ether acetate, and 5.96 g of propylene glycol monomethyl ether, and the resultant mixture was filtered with a polytetrafluoroethylene-made micro filter having a pore size of 0.1 μm, to thereby prepare a solution of a protective film-forming composition.

[Applicability Test]

Each of the protective film-forming composition solutions prepared in Comparative Examples 1 to 16 and Examples 1 to 46 was applied onto a silicon wafer with a spin coater, and then baked on a hot plate at 240° C. for 90 seconds, to thereby form a protective film. The applicability of the composition was determined at this point of time. As shown in Tables 1 to 4 below, the symbol "O" corresponds to a sample wherein a uniform film was formed, and the symbol "x" corresponds to a sample wherein a non-uniform film was formed.

The abbreviations and meanings thereof described in Tables 1 to 4 and 6 to 9 are as follows. In these tables, the numerical value below each abbreviation represents the amount (% by mass) of a crosslinking agent or an additive of Formula (1a), (1b), or (1c) relative to the amount of the resin, or the amount (% by mass) of a crosslinking catalyst (acid catalyst) relative to the amount of the crosslinking agent.

TMOM-BP: 3,3',5,5'-tetramethoxymethyl-4,4-dihydroxybiphenyl
TMOM-BIPA: tetramethoxymethylbisphenol A
TMOM-BIPS: tetramethoxymethylbisphenol S
PL-LI: 1,3,4,6-tetrakis(methoxymethyl)glycoluril
PyPTS: pyridinium p-toluenesulfonate
PyPSA: pyridinium p-hydroxybenzenesulfonate
PyTFMS: pyridinium trifluoromethanesulfonate
PSA: p-hydroxybenzenesulfonic acid
TAG: TAG2689
GA: gallic acid
DHBA: 3,4-dihydroxybenzoic acid
HHBP: 2,3,3',4,4',5'-hexahydroxybenzophenone
MBNAO: 1,1'-methylenebis(naphthalen-2-ol)
TrHBP: 2,3,4-trihydroxybenzophenone
TeHBP-1: 2,3',4,4'-tetrahydroxybenzophenone
TeHBP-2: 2,3,4,4'-tetrahydroxybenzophenone
THTMSI: 5,5',6,6'-tetrahydroxy-3,3,3',3'-tetramethyl-1,1'-spirobiindane
THDPM: 2,3,4-trihydroxydiphenylmethane

TABLE 1

| | Resin | Cross-linking agent | Cross-linking catalyst | Additive Formula (1a), (1b), or (1c) | Applicability test |
|---|---|---|---|---|---|
| Comparative Example 1 | Synthesis Example 1 | TMOM-BP 30 | PyPSA 5 | Absent | O |
| Comparative Example 2 | Synthesis Example 1 | TMOM-BP 30 | PyPTS 5 | Absent | O |
| Comparative Example 3 | Synthesis Example 1 | PL-LI 30 | PyPSA 5 | Absent | O |
| Comparative Example 4 | Synthesis Example 1 | PL-LI 30 | PyPTS 5 | Absent | O |
| Comparative Example 5 | Synthesis Example 1 | PL-LI 30 | TAG 5 | Absent | O |
| Comparative Example 6 | Synthesis Example 2 | TMOM-BP 30 | PyPTS 5 | Absent | O |
| Comparative Example 7 | Synthesis Example 3 | TMOM-BP 20 | PyPSA 5 | Absent | O |
| Comparative Example 8 | Synthesis Example 4 | TMOM-BP 30 | TAG 5 | Absent | O |
| Comparative Example 9 | MBNAO | TMOM-BP 30 | PyPSA 10 | Absent | O |
| Comparative Example 10 | MBNAO | PL-LI 30 | PyPSA 10 | Absent | O |
| Comparative Example 11 | Synthesis Example 5 | PL-LI 10 | PSA 10 | Absent | O |
| Comparative Example 12 | Synthesis Example 5 | TMOM-BP 10 | PSA 10 | Absent | O |
| Comparative Example 13 | Synthesis Example 6 | PL-LI 10 | PSA 10 | Absent | O |
| Comparative Example 14 | Synthesis Example 6 | TMOM-BP 10 | PSA 10 | Absent | O |
| Comparative Example 15 | Synthesis Example 5 | TMOM-BP 10 | PyTFMS 10 | GA 100 | X |
| Comparative Example 16 | Synthesis Example 1 | TMOM-BP 20 | PyPTS 5 | Absent | O |

TABLE 2

| | Resin | Cross-linking agent | Cross-linking catalyst | Additive Formula (1a), (1b), or (1c) | Applicability test |
|---|---|---|---|---|---|
| Example 1 | Synthesis Example 1 | TMOM-BP 30 | PyPSA 5 | GA 2.5 | O |
| Example 2 | Synthesis Example 1 | TMOM-BP 30 | PyPTS 5 | GA 2.5 | O |
| Example 3 | Synthesis Example 1 | TMOM-BP 30 | PyPSA 5 | HHBP 2.5 | O |
| Example 4 | Synthesis Example 1 | TMOM-BP 30 | PyPTS 5 | HHBP 2.5 | O |
| Example 5 | Synthesis Example 1 | PL-LI 30 | PyPSA 5 | GA 2.5 | O |
| Example 6 | Synthesis Example 1 | PL-LI 30 | PyPTS 5 | GA 2.5 | O |
| Example 7 | Synthesis Example 1 | PL-LI 30 | TAG 5 | GA 2.5 | O |
| Example 8 | Synthesis Example 1 | PL-LI 30 | PyPSA 5 | HHBP 2.5 | O |
| Example 9 | Synthesis Example 1 | PL-LI 30 | PyPTS 5 | HHBP 2.5 | O |
| Example 10 | Synthesis Example 1 | PL-LI 30 | TAG 5 | HHBP 2.5 | O |
| Example 11 | Synthesis Example 2 | TMOM-BP 30 | PyPTS 5 | GA 2.5 | O |
| Example 12 | Synthesis Example 3 | TMOM-BP 20 | PyPSA 15 | GA 2.5 | O |
| Example 13 | Synthesis Example 3 | TMOM-BP 20 | PyPTS 15 | GA 2.5 | O |
| Example 14 | Synthesis Example 3 | TMOM-BP 20 | TAG 15 | GA 2.5 | O |

TABLE 3

| | Resin | Cross-linking agent | Cross-linking catalyst | Additive Formula (1a), (1b), or (1c) | Applicability test |
|---|---|---|---|---|---|
| Example 15 | Synthesis Example 4 | TMOM-BP 30 | TAG 5 | GA 2.5 | O |
| Example 16 | Synthesis Example 4 | TMOM-BP 30 | TAG 5 | GA 5 | O |
| Example 17 | Synthesis Example 4 | TMOM-BP 30 | TAG 5 | GA 25 | O |
| Example 18 | MBNAO | TMOM-BP 30 | PyPSA 10 | GA 5 | O |

TABLE 3-continued

| | Resin | Cross-linking agent | Cross-linking catalyst | Additive Formula (1a), (1b), or (1c) | Applicability test |
|---|---|---|---|---|---|
| Example 19 | MBNAO | PL-LI 30 | PyPSA 10 | GA 5 | ○ |
| Example 20 | MBNAO | PL-LI 30 | PyPSA 10 | HHBP 5 | ○ |
| Example 21 | Synthesis Example 5 | PL-LI 10 | PSA 10 | GA 5 | ○ |
| Example 22 | Synthesis Example 5 | PL-LI 10 | PyTFMS 10 | GA 5 | ○ |
| Example 23 | Synthesis Example 5 | TMOM-BP 10 | PSA 10 | GA 5 | ○ |
| Example 24 | Synthesis Example 5 | TMOM-BP 10 | PyTFMS 10 | GA 5 | ○ |
| Example 25 | Synthesis Example 6 | PL-LI 10 | PSA 10 | GA 5 | ○ |
| Example 26 | Synthesis Example 6 | PL-LI 10 | PyTFMS 10 | GA 5 | ○ |
| Example 27 | Synthesis Example 6 | TMOM-BP 10 | PSA 10 | GA 5 | ○ |
| Example 28 | Synthesis Example 6 | TMOM-BP 10 | PyTFMS 10 | GA 5 | ○ |
| Example 29 | Synthesis Example 5 | TMOM-BP 10 | PyTFMS 10 | GA 10 | ○ |
| Example 30 | Synthesis Example 5 | TMOM-BP 10 | PyTFMS 10 | GA 20 | ○ |

TABLE 4

| | Resin | Cross-linking agent | Cross-linking catalyst | Additive Formula (1a), (1b), or (1c) | Applicability test |
|---|---|---|---|---|---|
| Example 31 | Synthesis Example 5 | TMOM-BP 10 | PyTFMS 10 | GA 30 | ○ |
| Example 32 | Synthesis Example 5 | TMOM-BP 10 | PyTFMS 10 | GA 40 | ○ |
| Example 33 | Synthesis Example 5 | TMOM-BP 10 | PyTFMS 10 | GA 50 | ○ |
| Example 34 | Synthesis Example 5 | TMOM-BP 10 | PyTFMS 10 | GA 60 | ○ |
| Example 35 | Synthesis Example 5 | TMOM-BP 10 | PyTFMS 10 | GA 75 | ○ |
| Example 36 | Synthesis Example 5 | TMOM BIP-A 10 | PyTFMS 10 | GA 5 | ○ |
| Example 37 | Synthesis Example 5 | TMOM BIP-S 10 | PyTFMS 10 | GA 5 | ○ |
| Example 38 | Synthesis Example 5 | TMOM-BP 10 | PyTFMS 10 | DHBA 5 | ○ |
| Example 39 | Synthesis Example 5 | TMOM-BP 10 | PyTFMS 10 | HHBP 5 | ○ |
| Example 40 | Synthesis Example 1 | TMOM-BP 20 | PyPTS 5 | GA 2.5 | ○ |
| Example 41 | Synthesis Example 1 | TMOM-BP 20 | PyPTS 5 | HHBP 2.5 | ○ |
| Example 42 | Synthesis Example 1 | TMOM-BP 20 | PyPTS 5 | TrHBP 2.5 | ○ |
| Example 43 | Synthesis Example 1 | TMOM-BP 20 | PyPTS 5 | TeHBP-1 2.5 | ○ |
| Example 44 | Synthesis Example 1 | TMOM-BP 20 | PyPTS 5 | TeHBP-2 2.5 | ○ |
| Example 45 | Synthesis Example 1 | TMOM-BP 20 | PyPTS 5 | THTMSI 2.5 | ○ |
| Example 46 | Synthesis Example 1 | TMOM-BP 20 | PyPTS 5 | THDPM 2.5 | ○ |

The results shown in Tables 1 to 4 above indicated that the protective film-forming compositions prepared in Examples 1 to 46 have excellent applicability to a silicon wafer. The results also indicated that the protective film-forming composition prepared in Comparative Example 15, which contains an excess amount of the compound of Formula (1a), (1b), or (1c), cannot form a uniform film on a silicon wafer.

[Test for Elution in Resist Solvent]

Each of the protective film-forming composition solutions prepared in Comparative Examples 1 to 14 and 16 and Examples 1 to 46 was applied onto a silicon wafer with a spin coater, and then baked on a hot plate at 180° C. to 300° C. for 60 seconds or 90 seconds, to thereby form a protective film. The protective film was immersed in solvents used for a resist; i.e., ethyl lactate, propylene glycol monomethyl ether, propylene glycol monomethyl ether acetate, and cyclohexanone. The evaluation was not performed on the sample that formed a non-uniform film in the applicability evaluation test. Each of the uniform protective films formed from the compositions did not dissolve in any of the solvents.

[Test for Resistance Against Basic Aqueous Hydrogen Peroxide Solution]

Each of the protective film-forming compositions prepared in Comparative Examples 1 to 14 and 16 and Examples 1 to 46 was used to form a protective film on a silicon substrate having a titanium nitride film formed on its surface. The protective film was scratched with a cutter knife to prepare a sample having 100 cross-cut scratches (1 mm×1 mm). The sample was immersed in a basic aqueous hydrogen peroxide solution having a composition shown in Table 5 below at the temperature shown in the table. Subsequently, the sample was washed with water and then dried. Thereafter, the state of peeling of the protective film was determined by visual observation. The results are shown in Tables 6 to 9 below. "Immersion time" shown in Tables 6 to 9 refers to the period of time from the initiation of immersion of the sample in the basic aqueous hydrogen peroxide solution to the peeling off of the protective film.

TABLE 5

Composition of Basic Aqueous Hydrogen Peroxide Solution and Treatment Temperature

| 28% by mass aqueous ammonia solution | 33% by mass aqueous hydrogen peroxide solution | Water | Temperature |
|---|---|---|---|
| 25 mL | 100 mL | 500 mL | 50° C. |

TABLE 6

| | Resin | Cross-linking agent | Cross-linking catalyst | Additive Formula (1a), (1b), or (1c) | Immersion time |
|---|---|---|---|---|---|
| Comparative Example 1 | Synthesis Example 1 | TMOM-BP 30 | PyPSA 5 | Absent | 15 sec |
| Comparative Example 2 | Synthesis Example 1 | TMOM-BP 30 | PyPTS 5 | Absent | 1 min |
| Comparative Example 3 | Synthesis Example 1 | PL-LI 30 | PyPSA 5 | Absent | 5 sec |
| Comparative Example 4 | Synthesis Example 1 | PL-LI 30 | PyPTS 5 | Absent | 5 sec |
| Comparative Example 5 | Synthesis Example 1 | PL-LI 30 | TAG 5 | Absent | 30 sec |
| Comparative Example 6 | Synthesis Example 2 | TMOM-BP 30 | PyPTS 5 | Absent | 45 sec |
| Comparative Example 7 | Synthesis Example 3 | TMOM-BP 20 | PyPSA 5 | Absent | 10 sec |
| Comparative Example 8 | Synthesis Example 4 | TMOM-BP 30 | TAG 5 | Absent | 1 min |

TABLE 6-continued

| | Resin | Cross-linking agent | Cross-linking catalyst | Additive Formula (1a), (1b), or (1c) | Immersion time |
|---|---|---|---|---|---|
| Comparative Example 9 | MBNAO | TMOM-BP 30 | PyPSA 10 | Absent | 1 min |
| Comparative Example 10 | MBNAO | PL-LI 30 | PyPSA 10 | Absent | 15 sec |
| Comparative Example 11 | Synthesis Example 5 | PL-LI 10 | PSA 10 | Absent | <30 sec |
| Comparative Example 12 | Synthesis Example 5 | TMOM-BP 10 | PSA 10 | Absent | <30 sec |
| Comparative Example 13 | Synthesis Example 6 | PL-LI 10 | PSA 10 | Absent | <30 sec |
| Comparative Example 14 | Synthesis Example 6 | TMOM-BP 10 | PSA 10 | Absent | <30 sec |
| Comparative Example 16 | Synthesis Example 1 | TMOM-BP 20 | PyPTS 5 | Absent | 2 min 30 sec |

TABLE 7

| | Resin | Cross-linking agent | Cross-linking catalyst | Additive Formula (1a), (1b), or (1c) | Immersion time |
|---|---|---|---|---|---|
| Example 1 | Synthesis Example 1 | TMOM-BP 30 | PyPSA 5 | GA 2.5 | 3 min |
| Example 2 | Synthesis Example 1 | TMOM-BP 30 | PyPTS 5 | GA 2.5 | 5 min 30 sec |
| Example 3 | Synthesis Example 1 | TMOM-BP 30 | PyPSA 5 | HHBP 2.5 | 3 min 10 sec |
| Example 4 | Synthesis Example 1 | TMOM-BP 30 | PyPTS 5 | HHBP 2.5 | 7 min 30 sec |
| Example 5 | Synthesis Example 1 | PL-LI 30 | PyPSA 5 | GA 2.5 | 15 sec |
| Example 6 | Synthesis Example 1 | PL-LI 30 | PyPTS 5 | GA 2.5 | 20 sec |
| Example 7 | Synthesis Example 1 | PL-LI 30 | TAG 5 | GA 2.5 | 2 min 30 sec |
| Example 8 | Synthesis Example 1 | PL-LI 30 | PyPSA 5 | HHBP 2.5 | 30 sec |
| Example 9 | Synthesis Example 1 | PL-LI 30 | PyPTS 5 | HHBP 2.5 | 1 min |
| Example 10 | Synthesis Example 1 | PL-LI 30 | TAG 5 | HHBP 2.5 | 4 min 20 sec |
| Example 11 | Synthesis Example 2 | TMOM-BP 30 | PyPTS 5 | GA 2.5 | 4 min 30 sec |
| Example 12 | Synthesis Example 3 | TMOM-BP 20 | PyPSA 15 | GA 2.5 | 1 min 30 sec |

TABLE 7-continued

| | Resin | Cross-linking agent | Cross-linking catalyst | Additive Formula (1a), (1b), or (1c) | Immersion time |
|---|---|---|---|---|---|
| Example 13 | Synthesis Example 3 | TMOM-BP 20 | PyPTS 15 | GA 2.5 | 2 min 30 sec |
| Example 14 | Synthesis Example 3 | TMOM-BP 20 | TAG 15 | GA 2.5 | 9 min |

TABLE 8

| | Resin | Cross-linking agent | Cross-linking catalyst | Additive Formula (1a), (1b), or (1c) | Immersion time |
|---|---|---|---|---|---|
| Example 15 | Synthesis Example 4 | TMOM-BP 30 | TAG 5 | GA 2.5 | 6 min 30 sec |
| Example 16 | Synthesis Example 4 | TMOM-BP 30 | TAG 5 | GA 5 | 8 min |
| Example 17 | Synthesis Example 4 | TMOM-BP 30 | TAG 5 | GA 25 | 1 min 10 sec |
| Example 18 | MBNAO | TMOM-BP 30 | PyPSA 10 | GA 5 | 1 min 30 sec |
| Example 19 | MBNAO | PL-LI 30 | PyPSA 10 | GA 5 | 30 sec |
| Example 20 | MBNAO | PL-LI 30 | PyPSA 10 | HHBP 5 | 40 sec |
| Example 21 | Synthesis Example 5 | PL-LI 10 | PSA 10 | GA 5 | 30 sec |
| Example 22 | Synthesis Example 5 | PL-LI 10 | PyTFMS 10 | GA 5 | 30 sec |
| Example 23 | Synthesis Example 5 | TMOM-BP 10 | PSA 10 | GA 5 | 1 min |
| Example 24 | Synthesis Example 5 | TMOM-BP 10 | PyTFMS 10 | GA 5 | 1 min |
| Example 25 | Synthesis Example 6 | PL-LI 10 | PSA 10 | GA 5 | 1 min |
| Example 26 | Synthesis Example 6 | PL-LI 10 | PyTFMS 10 | GA 5 | 1 min 30 sec |
| Example 27 | Synthesis Example 6 | TMOM-BP 10 | PSA 10 | GA 5 | 1 min |
| Example 28 | Synthesis Example 6 | TMOM-BP 10 | PyTFMS 10 | GA 5 | 1 min 30 sec |
| Example 29 | Synthesis Example 5 | TMOM-BP 10 | PyTFMS 10 | GA 10 | 1 min 30 sec |
| Example 30 | Synthesis Example 5 | TMOM-BP 10 | PyTFMS 10 | GA 20 | 1 min 30 sec |

TABLE 9

| | Resin | Cross-linking agent | Cross-linking catalyst | Additive Formula (1a), (1b), or (1c) | Immersion time |
|---|---|---|---|---|---|
| Example 31 | Synthesis Example 5 | TMOM-BP 10 | PyTFMS 10 | GA 30 | 1 min |
| Example 32 | Synthesis Example 5 | TMOM-BP 10 | PyTFMS 10 | GA 40 | 1 min |
| Example 33 | Synthesis Example 5 | TMOM-BP 10 | PyTFMS 10 | GA 50 | 1 min |
| Example 34 | Synthesis Example 5 | TMOM-BP 10 | PyTFMS 10 | GA 60 | 1 min |
| Example 35 | Synthesis Example 5 | TMOM-BP 10 | PyTFMS 10 | GA 75 | 1 min |

TABLE 9-continued

| | Resin | Cross-linking agent | Cross-linking catalyst | Additive Formula (1a), (1b), or (1c) | Immersion time |
|---|---|---|---|---|---|
| Example 36 | Synthesis Example 5 | TMOM BIP-A 10 | PyTFMS 10 | GA 5 | 1 min |
| Example 37 | Synthesis Example 5 | TMOM BIP-S 10 | PyTFMS 10 | GA 5 | 1 min 20 sec |
| Example 38 | Synthesis Example 5 | TMOM-BP 10 | PyTFMS 10 | DHBA 5 | 30 sec |
| Example 39 | Synthesis Example 5 | TMOM-BP 10 | PyTFMS 10 | HHBP 5 | 30 sec |
| Example 40 | Synthesis Example 1 | TMOM-BP 20 | PyPTS 5 | GA 2.5 | 6 min 15 sec |
| Example 41 | Synthesis Example 1 | TMOM-BP 20 | PyPTS 5 | HHBP 2.5 | 7 min 15 sec |
| Example 42 | Synthesis Example 1 | TMOM-BP 20 | PyPTS 5 | TrHBP 2.5 | 3 min 30 sec |
| Example 43 | Synthesis Example 1 | TMOM-BP 20 | PyPTS 5 | TeHBP-1 2.5 | >10 min 30 sec |
| Example 44 | Synthesis Example 1 | TMOM-BP 20 | PyPTS 5 | TeHBP-2 2.5 | 4 min 45 sec |
| Example 45 | Synthesis Example 1 | TMOM-BP 20 | PyPTS 5 | THTMSI 2.5 | 4 min 45 sec |
| Example 46 | Synthesis Example 1 | TMOM-BP 20 | PyPTS 5 | THDPM 2.5 | 3 min 45 sec |

The results shown in Tables 6 to 9 above indicated that the protective films formed from the protective film-forming compositions prepared in Examples 1 to 46 exhibit a longer immersion time, as compared with the protective films formed from the protective film-forming compositions prepared in Comparative Examples 1 to 14 and 16, which contain the resin and the crosslinking agent in the same amounts as in Examples 1 to 46 but do not contain a compound of Formula (1a), (1b), or (1c). Thus, the results indicated that incorporation of a compound of Formula (1a), (1b), or (1c) effectively improves the resistance of the protective film against a basic aqueous hydrogen peroxide solution. Regardless of change in the types of the crosslinking agent and the crosslinking catalyst, the resistance of the protective film against a basic aqueous hydrogen peroxide solution was effectively improved by incorporation of a compound of Formula (1a), (1b), or (1c).

The invention claimed is:

1. A composition for forming a protective film against an aqueous hydrogen peroxide solution, the composition comprising a resin; a compound of the following Formula (1a), (1b), or (1c):

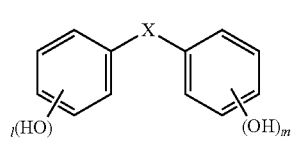
(1a)

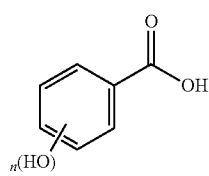
(1b)

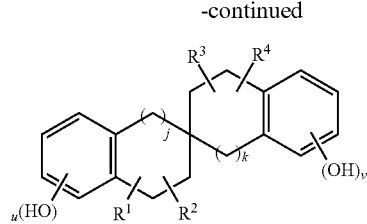
(1c)

(wherein X is a carbonyl group or a methylene group; l and m are each independently an integer of 0 to 5 so as to satisfy the relation: $3 \le l+m \le 10$; n is an integer of 2 to 5; u and v are each independently an integer of 0 to 4 so as to satisfy the relation: $3 \le u+v \le 8$; $R^1$, $R^2$, $R^3$, and $R^4$ are each independently a hydrogen atom, a hydroxy group, a $C_{1-10}$ hydrocarbon group optionally having at least one hydroxy group as a substituent and optionally having at least one double bond in a main chain, or a $C_{6-20}$ aryl group optionally having at least one hydroxy group as a substituent; when $R^1$, $R^2$, $R^3$, and $R^4$ are each the $C_{1-10}$ hydrocarbon group, $R^1$ and $R^2$ optionally form a benzene ring together with a ring carbon atom to which $R^1$ and $R^2$ are bonded, $R^3$ and $R^4$ optionally form a benzene ring together with a ring carbon atom to which $R^3$ and $R^4$ are bonded, or the benzene ring optionally has at least one hydroxy group as a substituent; and j and k are each independently 0 or 1; a crosslinking agent; a crosslinking catalyst; and a solvent, wherein the amount of the compound of Formula (1a), (1b), or (1c) is at most 80% by mass relative to the amount of the resin, and the amount of the crosslinking agent is 5% by mass to 40% by mass relative to the amount of the resin.

2. The composition for forming a protective film against an aqueous hydrogen peroxide solution according to claim 1, wherein the resin is a polymer having a weight average molecular weight of 1,000 or more.

3. The composition for forming a protective film against an aqueous hydrogen peroxide solution according to claim 1, wherein the resin is a monomer having a molecular weight of 600 or less.

4. The composition for forming a protective film against an aqueous hydrogen peroxide solution according to claim 3, wherein the monomer is a compound of the following Formula (2):

Ar-Q-Ar    (2)

(wherein each Ar is an aryl group, and the aryl group has at least one hydroxy group as a substituent; and Q is a methylene group or a divalent linking group having at least one benzene ring or naphthalene ring.

5. The composition for forming a protective film against an aqueous hydrogen peroxide solution according to claim 1, wherein the compound of Formula (1a) is any of compounds of the following Formulae (1a-1) to (1a-5); the compound of Formula (1b) is a compound of the following Formula (1b-1) or (1b-2); and the compound of Formula (1c) is a compound of the following Formula (1c-1)

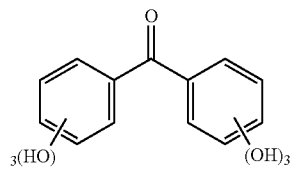
(1a-1)

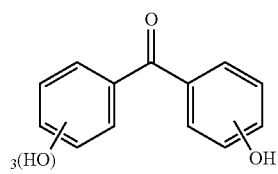
(1a-2)

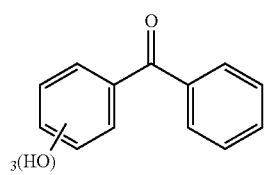
(1a-3)

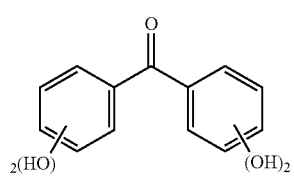
(1a-4)

(1a-5)

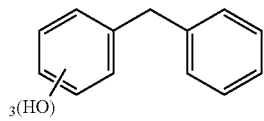
(1b-1)

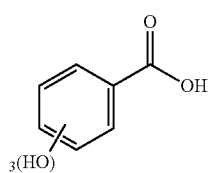
(1b-2)

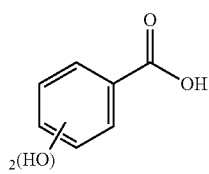
(1c-1)

6. The composition for forming a protective film against an aqueous hydrogen peroxide solution according to claim 1, wherein the composition is a composition for forming a resist underlayer film.

7. A pattern forming method comprising forming a protective film, on a semiconductor substrate optionally having an inorganic film formed on its surface, from the composition for forming a protective film against an aqueous hydrogen peroxide solution according to claim 1; forming a resist pattern on the protective film; dry-etching the protective film with the resist pattern serving as a mask, to thereby expose the surface of the inorganic film or the semiconductor substrate; wet-etching the inorganic film or the semiconductor substrate with the dry-etched protective film serving as a mask by using an aqueous hydrogen peroxide solution; and washing the wet-etched inorganic film or semiconductor substrate.

* * * * *